(12) United States Patent
Lu et al.

(10) Patent No.: US 12,052,815 B2
(45) Date of Patent: Jul. 30, 2024

(54) MANUFACTURING METHOD OF CIRCUIT BOARD

(71) Applicant: Unimicron Technology Corp., Taoyuan (TW)

(72) Inventors: Chih-Chiang Lu, Taoyuan (TW); Heng-Ming Nien, Taoyuan (TW); Ching-Sheng Chen, Hsinchu County (TW); Ching Chang, Taoyuan (TW); Ming-Ting Chang, New Taipei (TW); Chi-Min Chang, Taoyuan (TW); Shao-Chien Lee, Taipei (TW); Jun-Rui Huang, Taoyuan (TW); Shih-Lian Cheng, New Taipei (TW)

(73) Assignee: Unimicron Technology Corp., Taoyuan (TW)

( * ) Notice: Subject to any disclaimer, the term of this patent is extended or adjusted under 35 U.S.C. 154(b) by 0 days.

(21) Appl. No.: 18/447,265

(22) Filed: Aug. 9, 2023

(65) Prior Publication Data
US 2023/0389172 A1  Nov. 30, 2023

Related U.S. Application Data

(62) Division of application No. 17/496,791, filed on Oct. 8, 2021, now Pat. No. 11,785,707.
(Continued)

(30) Foreign Application Priority Data

Sep. 14, 2021 (TW) .................................. 110134181

(51) Int. Cl.
H05K 1/02 (2006.01)
H05K 1/11 (2006.01)
(Continued)

(52) U.S. Cl.
CPC .......... *H05K 1/0222* (2013.01); *H05K 1/113* (2013.01); *H05K 1/119* (2013.01); *H05K 3/429* (2013.01);
(Continued)

(58) Field of Classification Search
CPC ........ H05K 1/02; H05K 1/023; H05K 1/0231; H05K 1/092; H05K 1/0206; H05K 1/0222;
(Continued)

(56) References Cited

U.S. PATENT DOCUMENTS

2002/0017399 A1* 2/2002 Chang ............... H01L 23/49827
174/262
2003/0085058 A1* 5/2003 Komatsu .............. H05K 3/4069
174/257
(Continued)

*Primary Examiner* — Xiaoliang Chen
(74) *Attorney, Agent, or Firm* — JCIPRNET

(57) ABSTRACT

Provided is a manufacturing method of circuit board, including a first substrate, a second substrate, a third substrate, a fourth substrate, multiple conductive structures, and a conductive via structure. The third substrate has an opening and includes a first dielectric layer. The opening penetrates the third substrate, and the first dielectric layer fills the opening. Multiple conductive structures are formed so that the first substrate, the second substrate, the third substrate, and the fourth substrate are electrically connected through the conductive structures to define a ground path. A conductive via structure is formed to penetrate the first substrate, the second substrate, the first dielectric layer of the third substrate, and the fourth substrate. The conductive via structure is electrically connected to the first substrate and the fourth substrate to define a signal path, and the ground path surrounds the signal path.

15 Claims, 20 Drawing Sheets

Related U.S. Application Data

(60) Provisional application No. 63/139,795, filed on Jan. 21, 2021.

(51) Int. Cl.
*H05K 1/16* (2006.01)
*H05K 3/24* (2006.01)
*H05K 3/42* (2006.01)
*H05K 3/46* (2006.01)
*H05K 1/18* (2006.01)
*H05K 3/00* (2006.01)

(52) U.S. Cl.
CPC ............. *H05K 3/462* (2013.01); *H05K 1/181* (2013.01); *H05K 3/0094* (2013.01); *H05K 3/24* (2013.01); *H05K 2201/10734* (2013.01)

(58) Field of Classification Search
CPC .......... H05K 1/16; H05K 1/113; H05K 1/115; H05K 1/116; H05K 1/119; H05K 1/162; H05K 1/181; H05K 1/182; H05K 1/185; H05K 1/186; H05K 3/0094; H05K 3/24; H05K 3/42; H05K 3/46; H05K 3/426; H05K 3/429; H05K 3/462; H05K 3/4605; H05K 3/4641; H05K 3/4697; H05K 2201/068; H05K 2201/0187; H05K 2201/0959; H05K 2201/09545; H05K 2201/10242; H05K 2201/10734
USPC ........................ 361/760, 761, 763, 782, 792; 174/258–262, 266, 520
See application file for complete search history.

(56) References Cited

U.S. PATENT DOCUMENTS

| | | | |
|---|---|---|---|
| 2007/0124930 A1* | 6/2007 | Cheng .................. | H05K 1/0222 29/830 |
| 2010/0124035 A1* | 5/2010 | Bandholz ............... | H05K 1/162 361/782 |
| 2011/0086486 A1* | 4/2011 | Lee ................... | H01L 21/76898 257/E21.597 |
| 2012/0091468 A1* | 4/2012 | Choi ..................... | H01L 23/147 257/77 |
| 2013/0098669 A1* | 4/2013 | Yoshimura ............. | H05K 3/427 174/258 |
| 2013/0207241 A1* | 8/2013 | Lee ....................... | H01L 23/481 257/621 |
| 2013/0207242 A1* | 8/2013 | Lee ....................... | H01L 23/481 257/621 |
| 2015/0014045 A1* | 1/2015 | Brigham .................. | H05K 3/42 174/266 |
| 2015/0028470 A1* | 1/2015 | Gallegos ........... | H01L 21/76898 257/737 |
| 2015/0181693 A1* | 6/2015 | Wu ....................... | H05K 1/0222 174/262 |
| 2016/0088731 A1* | 3/2016 | Daghighian ........... | H05K 1/162 174/259 |
| 2016/0225694 A1* | 8/2016 | Barth .................... | H01L 23/481 |
| 2018/0374803 A1* | 12/2018 | Aoki ................. | H01L 23/49838 |
| 2020/0260587 A1* | 8/2020 | Min ................. | H01L 23/49827 |
| 2020/0275558 A1* | 8/2020 | Fujita ................. | H01L 21/4857 |

* cited by examiner

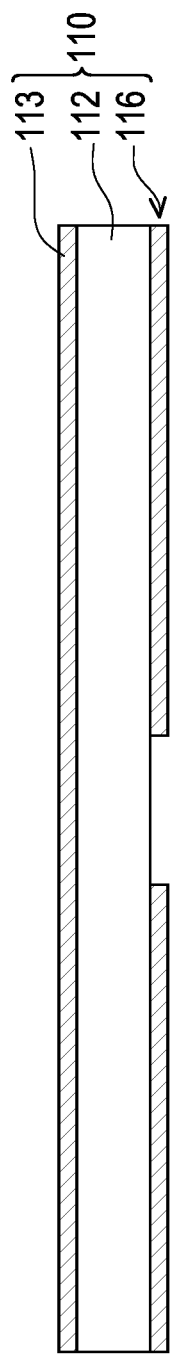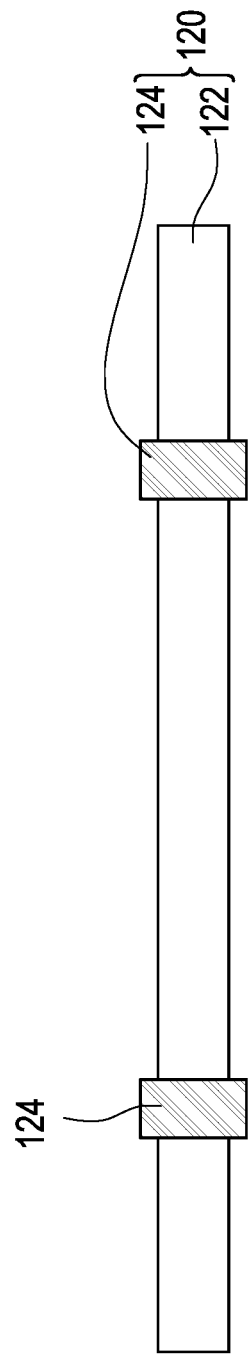

MANUFACTURING METHOD OF CIRCUIT BOARD

CROSS-REFERENCE TO RELATED APPLICATION

This application is a divisional application of U.S. application Ser. No. 17/496,791, filed on Oct. 8, 2021, now allowed. The prior application Ser. No. 17/496,791 claims the priority benefit of U.S. provisional application Ser. No. 63/139,795, filed on Jan. 21, 2021, and Taiwan application serial no. 110134181, filed on Sep. 14, 2021. The entirety of each of the above-mentioned patent applications is hereby incorporated by reference herein and made a part of this specification.

BACKGROUND

Technical Field

The disclosure relates to a substrate structure and a manufacturing method thereof, and more particularly to a manufacturing method of a circuit board.

Description of Related Art

A coaxial via designed in an existing circuit board requires one or more insulation layers for blockage between an internal conductor layer and an external conductor layer, with the insulation layer formed by laminating build-up layers. Therefore, impedance mismatch between both ends of the coaxial via leads to a gap of electromagnetic interference (EMI) shielding, which thereby affects high-frequency signal integrity. In addition, in the coaxial via design, both ends of a signal path and both ends of a ground path are respectively located on different planes, and noise interference cannot be reduced.

SUMMARY

The disclosure provides a manufacturing method of a circuit board for manufacturing the circuit board, which has a good signal loop and may have better signal integrity.

The manufacturing method of the circuit board of the disclosure includes the following steps. A first substrate, a second substrate, a third substrate, and a fourth substrate are provided. The third substrate has an opening and includes a first dielectric layer. The opening penetrates the third substrate, and the first dielectric layer fills the opening. The first substrate, the second substrate, the third substrate, and the fourth substrate are laminated so that the second substrate is located between the first substrate and the third substrate, and that the third substrate is located between the second substrate and the fourth substrate. Multiple conductive structures are formed so that the first substrate, the second substrate, the third substrate, and the fourth substrate are electrically connected through the conductive structures to define a ground path. A conductive via structure is formed to penetrate the first substrate, the second substrate, the first dielectric layer of the third substrate, and the fourth substrate. The conductive via structure is electrically connected to the first substrate and the fourth substrate to define a signal path, and the ground path surrounds the signal path.

In an embodiment of the disclosure, the above step of providing the first substrate, the second substrate, the third substrate, and the fourth substrate includes providing the first substrate. The first substrate includes a first core layer, a first conductive layer, and a first circuit layer. The first conductive layer and the first circuit layer are respectively disposed on two opposite sides of the first core layer. The second substrate is provided. The second substrate includes a base and multiple conductive pillars penetrating the base. The third substrate is provided. The third substrate further includes a second core layer, a second circuit layer, a third circuit layer, and a conductive connection layer. The second circuit layer and the third circuit layer are respectively disposed on two opposite sides of the second core layer. The conductive pillars of the second substrate are electrically connected to the first circuit layer and the second circuit layer. The second core layer has an opening, and the conductive connection layer covers the inner wall of the opening and is located between the first dielectric layer and the second core layer. The conductive connection layer is electrically connected to the second circuit layer and the third circuit layer. The fourth substrate is provided. The fourth substrate includes an insulation layer and a second conductive layer. The insulation layer is located between the third circuit layer and the second conductive layer.

In an embodiment of the disclosure, the conductive structures and the conductive via structure are simultaneously formed after the first substrate, the second substrate, the third substrate, and the fourth substrate are laminated.

In an embodiment of the disclosure, the step of forming the conductive structures and the conductive via structure includes forming multiple first blind vias, multiple second blind vias, and a through via. The first blind vias extend from the first conductive layer to the first circuit layer. The second blind vias extend from the second conductive layer to the third circuit layer. The through via penetrates the first core layer of the first substrate, the second substrate, the first dielectric layer of the third substrate, and the insulation layer of the fourth substrate. A conductive material layer is formed to fill the first blind vias and the second blind vias and extend to cover the first conductive layer, the second conductive layer, and the inner wall of the through via. The through via and the conductive material layer covering the through via define a conductive via structure. The conductive material layer filling the first blind vias defines multiple first conductive vias of the conductive structures. The conductive material layer filling the second blind vias defines multiple second conductive vias of the conductive structures.

In an embodiment of the disclosure, the above manufacturing method of the circuit board further includes patterning the conductive material layer, the first conductive layer, and the second conductive layer to form a first external circuit layer and a second external circuit layer after the conductive structures and the conductive via structure are formed. The first external circuit layer is located on the first core layer of the first substrate, and the second external circuit layer is located on the insulation layer of the fourth substrate.

In an embodiment of the disclosure, the above first external circuit layer includes a first signal circuit and a first ground circuit, and the second external circuit layer includes a second signal circuit and a second ground circuit. The first signal circuit, the conductive material layer, and the second signal circuit define the signal path. The first ground circuit, the first conductive vias, the first circuit layer, the conductive pillars, the second circuit layer, the conductive connection layer, the third circuit layer, the second conductive vias, and the second ground circuit define the ground path.

In an embodiment of the disclosure, the step of forming the conductive via structure further includes filling a second dielectric layer in the through via. The second dielectric layer fills the through via, and a first surface and a second surface of the second dielectric layer opposite to each other are respectively aligned with an upper surface and a lower surface of the conductive material layer.

In an embodiment of the disclosure, the above manufacturing method of the circuit board further includes forming a capping layer on the conductive material layer after the conductive via structure is formed. The capping layer covers the conductive material layer and the first surface and the second surface of the second dielectric layer. The capping layer, the conductive material layer, the first conductive layer, and the second conductive layer are patterned to form a first external circuit layer and a second external circuit layer. The first external circuit layer is located on the first core layer of the first substrate and on the first surface of the second dielectric layer. The second external circuit layer is located on the insulation layer of the fourth substrate and on the second surface of the second dielectric layer.

In an embodiment of the disclosure, the above step of providing the first substrate, the second substrate, the third substrate, and the fourth substrate includes providing the first substrate. The first substrate includes a first core layer, a first conductive layer, and a first circuit layer. The first conductive layer and the first circuit layer are respectively disposed on two opposite sides of the first core layer. The second substrate is provided. The second substrate includes a base. The third substrate is provided. The third substrate further includes a second core layer, a second circuit layer, a third circuit layer, and a conductive connection layer. The second circuit layer and the third circuit layer are respectively disposed on two opposite sides of the second core layer. The second core layer has an opening, and the conductive connection layer covers the inner wall of the opening and is located between the first dielectric layer and the second core layer. The conductive connection layer is electrically connected to the second circuit layer and the third circuit layer. The fourth substrate is provided. The fourth substrate includes an insulation layer and a second conductive layer. The insulation layer is located between the third circuit layer and the second conductive layer.

In an embodiment of the disclosure, the conductive structures and the conductive via structure are simultaneously formed after the first substrate, the second substrate, the third substrate, and the fourth substrate are laminated.

In an embodiment of the disclosure, the step of forming the conductive structures and the conductive via structure includes forming multiple first blind vias, multiple second blind vias, multiple third blind vias, and a through via. The first blind vias extend from the first conductive layer to the first circuit layer. The second blind vias extend from the second conductive layer to the third circuit layer. The third blind vias extend from the first conductive layer to the second circuit layer. The through via penetrates the first core layer of the first substrate, the second substrate, the first dielectric layer of the third substrate, and the insulation layer of the fourth substrate. A conductive material layer is formed to fill the first blind vias, the second blind vias, and the third blind vias, and extend to cover the first conductive layer, the second conductive layer, and the inner wall of the through via. The through via and the conductive material layer covering the through via define a conductive via structure. The conductive material layer filling the first blind vias defines multiple first conductive vias of the conductive structures. The conductive material layer filling the second blind vias defines multiple second conductive vias of the conductive structures. The conductive material layer filling the third blind vias defines multiple third conductive vias of the conductive structures.

In an embodiment of the disclosure, the above manufacturing method of the circuit board further includes patterning the conductive material layer, the first conductive layer, and the second conductive layer to form a first external circuit layer and a second external circuit layer after the conductive structures and the conductive via structure are formed. The first external circuit layer is located on the first core layer of the first substrate, and the second external circuit layer is located on the insulation layer of the fourth substrate.

In an embodiment of the disclosure, the above first external circuit layer includes a first signal circuit and a first ground circuit, and the second external circuit layer includes a second signal circuit and a second ground circuit. The first signal circuit, the conductive material layer, and the second signal circuit define the signal path. The first ground circuit, the third conductive vias, the second circuit layer, the conductive connection layer, the third circuit layer, the second conductive vias, and the second ground circuit define the ground path.

In an embodiment of the disclosure, the step of forming the conductive via structure further includes filling a second dielectric layer in the through via. The second dielectric layer fills the through via, and a first surface and a second surface of the second dielectric layer opposite to each other are respectively aligned with an upper surface and a lower surface of the conductive material layer.

In an embodiment of the disclosure, the above manufacturing method of the circuit board further includes forming a capping layer on the conductive material layer after the conductive via structure is formed. The capping layer covers the conductive material layer and the first surface and the second surface of the second dielectric layer. The capping layer, the conductive material layer, the first conductive layer, and the second conductive layer are patterned to form a first external circuit layer and a second external circuit layer. The first external circuit layer is located on the first core layer of the first substrate and on the first surface of the second dielectric layer. The second external circuit layer is located on the insulation layer of the fourth substrate and on the second surface of the second dielectric layer.

Based on the above, in the design of the manufacturing method of the circuit board of the disclosure, the conductive via structure is formed to penetrate the first substrate, the second substrate, the first dielectric layer of the third substrate, and the fourth substrate. The conductive via structure is electrically connected to the first substrate and the fourth substrate to define a signal path, and the ground path surrounds the signal path. In this way, a good high-frequency high-speed signal loop may be formed. Moreover, in subsequent application of integrated circuits and antennas, the problem of signal interference on a same plane may also be solved, and signal energy loss and noise interference may both be reduced. Therefore, signal transmission reliability may be enhanced.

In order to make the aforementioned features and advantages of the disclosure comprehensible, embodiments accompanied with drawings are described in detail below.

BRIEF DESCRIPTION OF THE DRAWINGS

FIG. 1A to FIG. 1H are schematic cross-sectional views of a manufacturing method of a circuit board according to an embodiment of the disclosure.

DESCRIPTION OF THE EMBODIMENTS

Figure 1C:
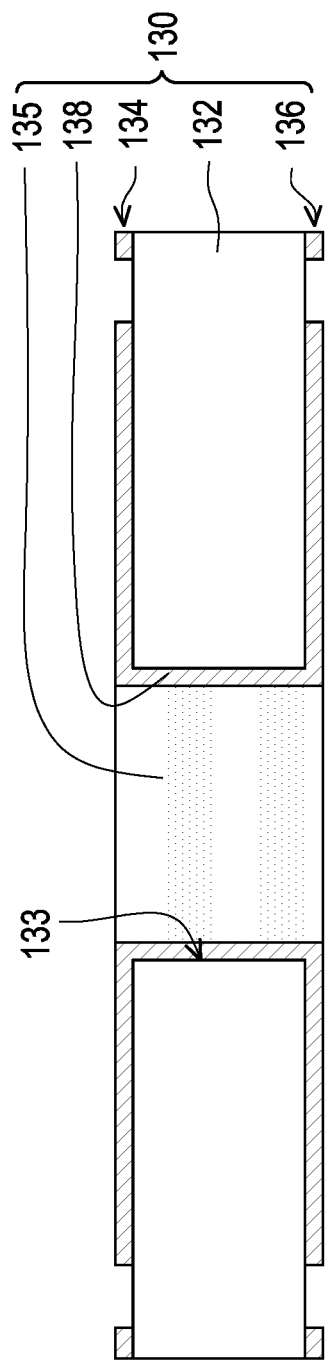

FIG. 1A to FIG. 1H are schematic cross-sectional views of a manufacturing method of a circuit board according to an embodiment of the disclosure. FIG. 1I is a schematic top view of the circuit board of FIG. 1H. Regarding the manufacturing method of the circuit board in this embodiment, with reference to FIG. 1A, FIG. 1B, FIG. 1C, and FIG. 1D together, a first substrate 110, a second substrate 120, a third substrate 130, and a fourth substrate 140 are provided.

In detail, with reference to FIG. 1A, in this embodiment, the first substrate 110 includes a first core layer 112, a first conductive layer 113, and a first circuit layer 116. The first conductive layer 113 and the first circuit layer 116 are respectively disposed on two opposite sides of the first core layer 112. The first conductive layer 113 is not patterned and completely covers a surface of one side of the first core layer 112, and the first circuit layer 116 exposes part of a surface of another side of the first core layer 112. Here, the first substrate 110 is, for example, a dielectric layer, and the material of the first conductive layer 113 and the first circuit layer 116 is, for example, copper.

Next, with reference to FIG. 1B, the second substrate 120 includes a base 122 and multiple conductive pillars 124 penetrating the base 122. The step of providing the second substrate 120 includes providing the base 122 first, and at this time, the base 122 is in a B-stage state, which means it has not been completely cured. In following, release films may be attached to two opposite sides of the base 122, and the release films are made of, for example, polyester polymer (PET). Afterwards, a drilling procedure is performed on the base 122 to form a via, and the drilling procedure is, for example but not limited to, laser drilling or mechanical drilling. Finally, a conductive adhesive material is filled in the via by printing or injection to form the conductive pillars 124. In following, the release films attached to the two opposite sides of the base 122 are removed so that two opposite surfaces of the conductive pillars 124 respectively protrude from the two opposite surfaces of the base 122, and the manufacturing of the second substrate 120 is completed.

Next, with reference to FIG. 1C, the third substrate 130 includes a second core layer 132, a second circuit layer 134, a first dielectric layer 135, a third circuit layer 136, and a conductive connection layer 138. The second core layer 132 has an opening 133, and the opening 133 penetrates the third substrate 130. The first dielectric layer 135 fills the opening 133. Here, two opposite sides of the first dielectric layer 135 are substantially aligned with two opposite ends of the opening 133. The second circuit layer 134 and the third circuit layer 136 are respectively disposed on two opposite sides of the second core layer 132. The conductive connection layer 138 covers an inner wall of the opening 133 and is located between the first dielectric layer 135 and the second core layer 132. The conductive connection layer 138 is electrically connected to the second circuit layer 134 and the third circuit layer 136.

Figure 1D:
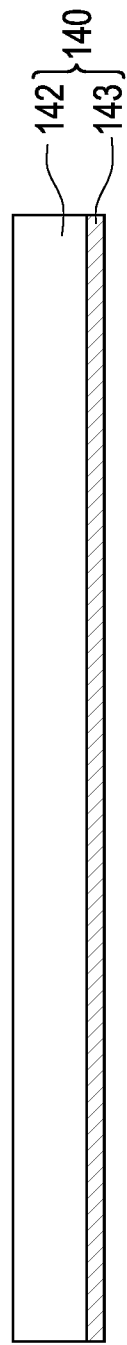

Next, with reference to FIG. 1D, the fourth substrate 140 includes an insulation layer 142 and a second conductive layer 143. Here, the second conductive layer 143 is not patterned and completely covers a surface of the insulation layer 142.

Figure 1E:
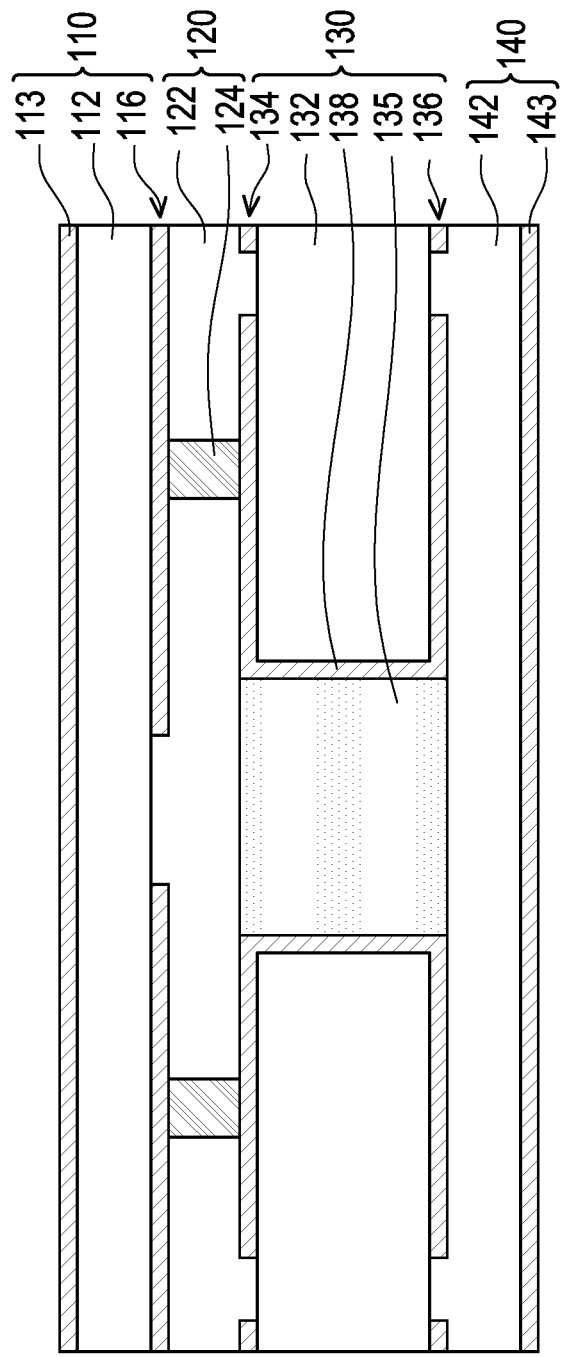

Next, with reference to FIG. 1E, the first substrate 110, the second substrate 120, the third substrate 130, and the fourth substrate 140 are laminated so that the second substrate 120 is located between the first substrate 110 and the third substrate 130, and that the third substrate 130 is located between the second substrate 120 and the fourth substrate 140. Here, since a thermocompression bonding process is adopted, the base 122 of the second substrate 120 at this time changes from the original B-stage state into a C-stage state, which means it is in a state of being fully cured, thereby connecting and fixing the first substrate 110 and the third substrate 130 on the second substrate 120. The conductive pillars 124 of the second substrate 120 abut the first circuit layer 116 and the second circuit layer 134 and thus generate deformation. Moreover, the conductive pillars 124 are electrically connected to the first circuit layer 116 of the first substrate 110 and the second circuit layer 134 of the third substrate 130. The insulation layer 142 of the fourth substrate 140 is located between the third circuit layer 136 and the second conductive layer 143.

Figure 1F:
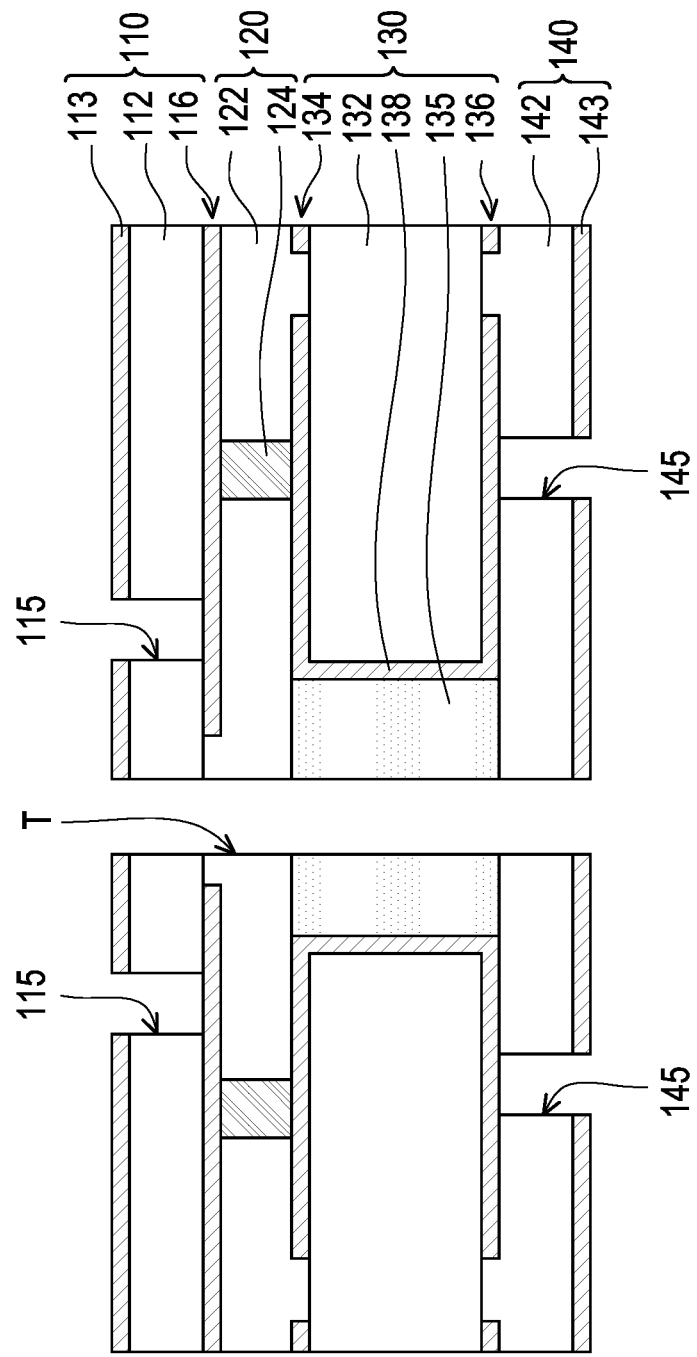

Next, with reference to FIG. 1F, multiple first blind vias 115, multiple second blind vias 145, and a through via T are formed. The first blind vias 115 extend from the first conductive layer 113 to the first circuit layer 116. The second blind vias 145 extend from the second conductive layer 143 to the third circuit layer 136. The through via T penetrates the first core layer 112 of the first substrate 110, the base 122 of the second substrate 120, the first dielectric layer 135 of the third substrate 130, and the insulation layer 142 of the fourth substrate 140. Here, the first blind vias 115 and the second blind vias 145 are formed by, for example, laser drilling, and the through via T is formed by, for example, mechanical drilling, but they are not limited thereto.

Figure 1G:
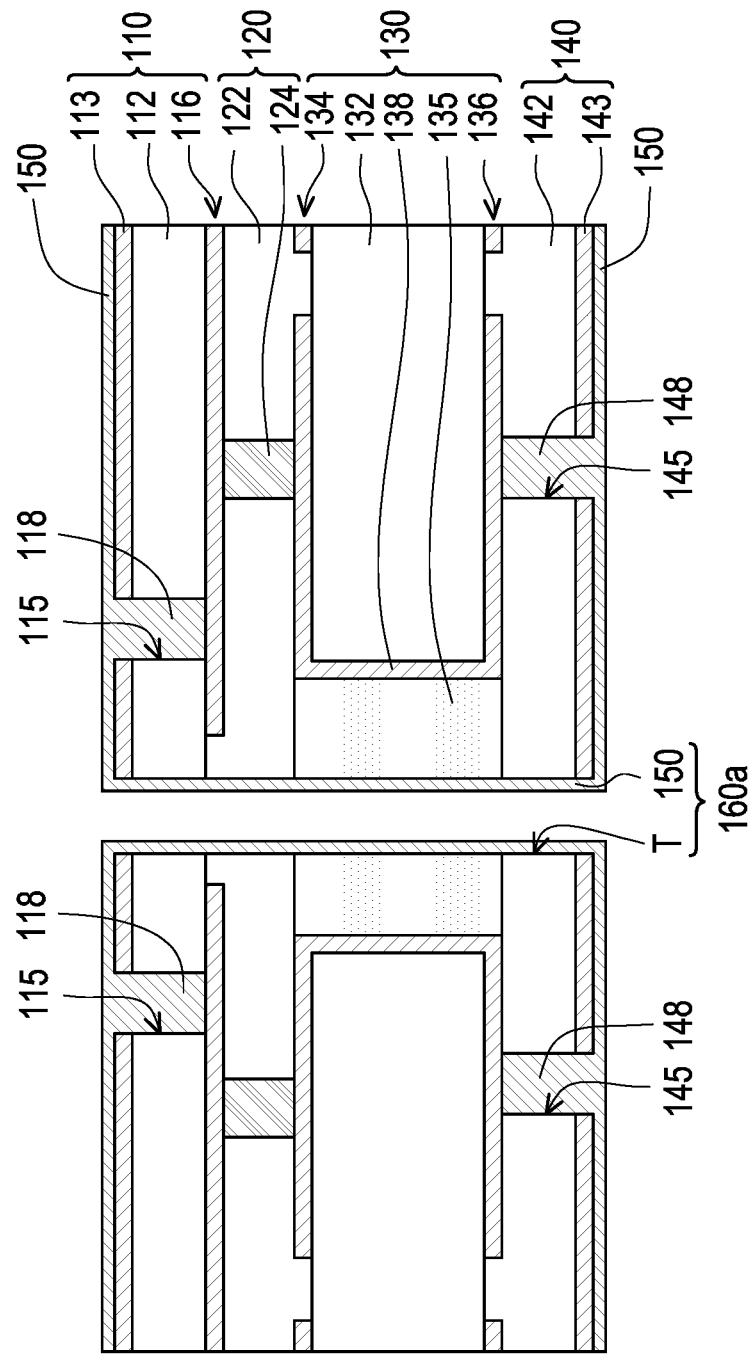

In following, with reference to FIG. 1G, a conductive material layer 150 is formed to fill the first blind vias 115 and the second blind vias 145, and extends to cover the first conductive layer 113, the second conductive layer 143, and an inner wall of the through via T. Here, the through via T and the conductive material layer 150 covering the through via T define a conductive via structure 160a. The conductive material layer 150 filling the first blind vias 115 defines multiple first conductive vias 118 of conductive structures. The conductive material layer 150 filling the second blind vias 145 defines multiple second conductive vias 148 of the conductive structures. Here, the conductive material layer 150 is formed by, for example, plating, and the conductive material layer 150 is, for example, copper, but it is not limited thereto.

In other words, in this embodiment, after the first substrate 110, the second substrate 120, the third substrate 130, and the fourth substrate 140 are laminated, the conductive structures (i.e., the first conductive vias 118 and the second conductive vias 148) and the conductive via structure 160a may be simultaneously formed.

Figure 1H:
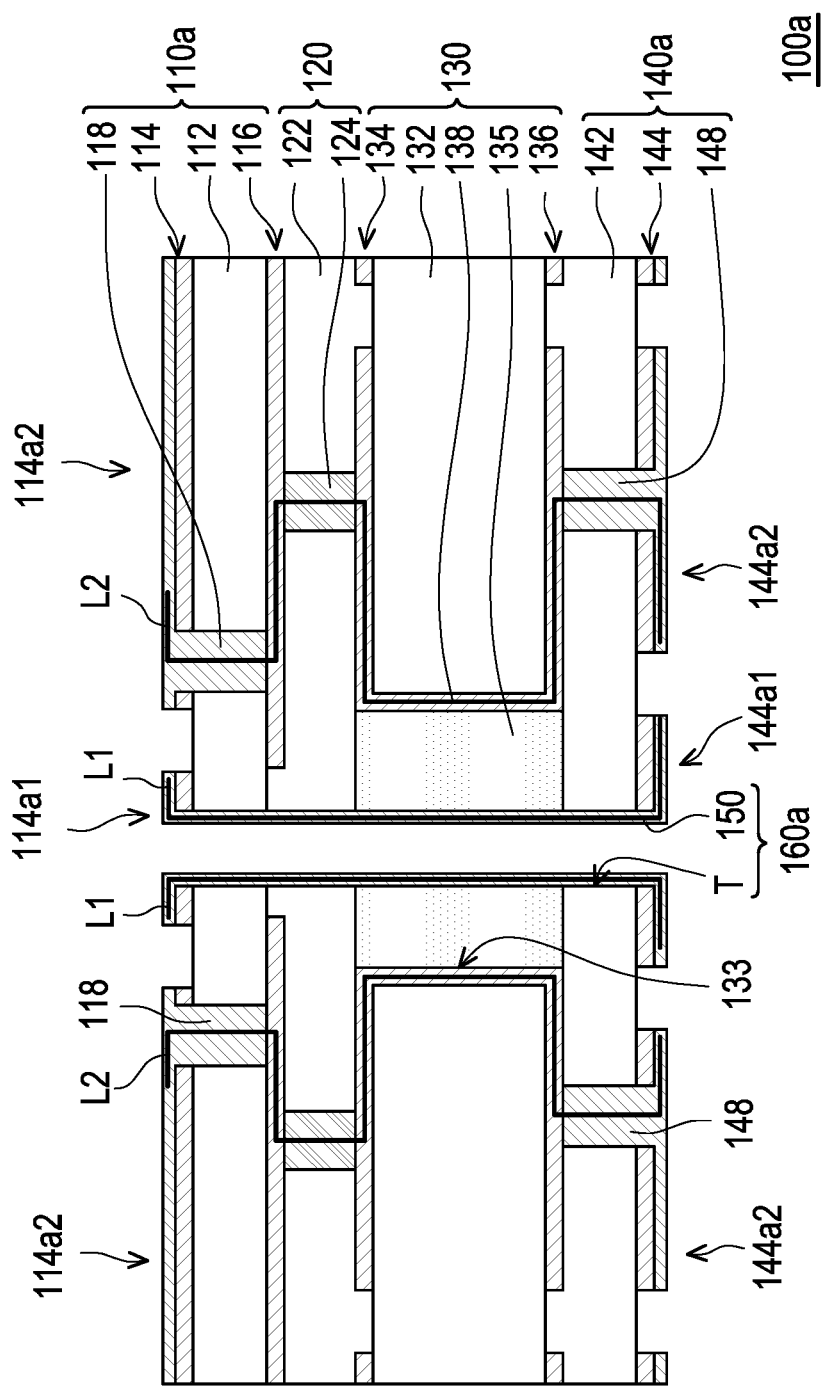
Figure 1I:
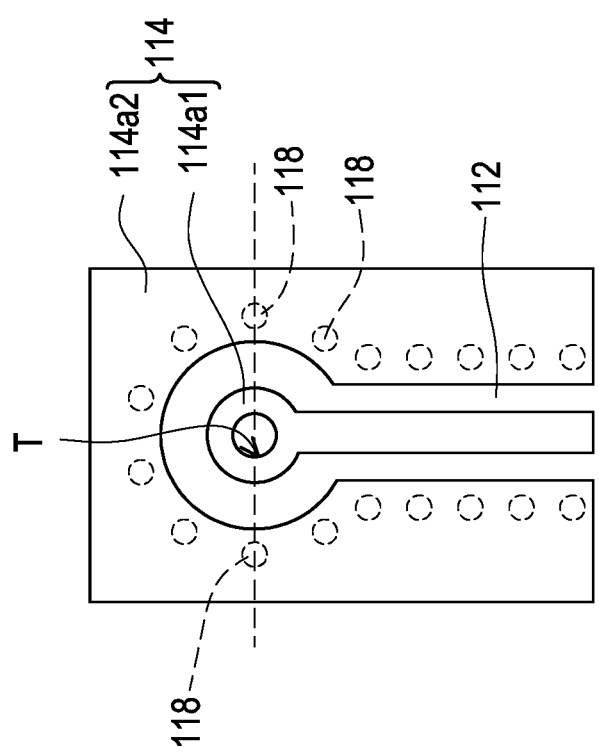
FIG. 1I is a schematic top view of the circuit board of FIG. 1H.

Finally, with reference to FIG. 1G and FIG. 1H together, the conductive material layer 150, the first conductive layer 113, and the second conductive layer 143 are patterned through a photolithography process to form a first external circuit layer 114 and a second external circuit layer 144. The first external circuit layer 114 is located on the first core layer 112 of a first substrate 110a, and the second external circuit layer 144 is located on the insulation layer 142 of a fourth substrate 140a. Here, the conductive via structure 160a is electrically connected to the first substrate 110a and the fourth substrate 140a to define a signal path L1, and the first substrate 110a, the second substrate 120, the third substrate 130, and the fourth substrate 140a may be electrically connected through the conductive structures (i.e., the first conductive vias 118 and the second conductive vias 148) to define a ground path L2. The ground path L2 surrounds the signal path L1. By this time, the manufacturing of a circuit board 100a has been completed.

In terms of structure, with reference to FIG. 1H and FIG. 1I together, the circuit board 100a includes the first substrate 110a, the second substrate 120, the third substrate 130, the fourth substrate 140a, the conductive structures, and the conductive via structure 160a. The second substrate 120 is disposed between the first substrate 110a and the third substrate 130. The third substrate 130 is disposed between the second substrate 120 and the fourth substrate 140a. The third substrate 130 has the opening 133 and includes the first dielectric layer 135. The opening 133 penetrates the third substrate 130, and the first dielectric layer 135 fills the opening 133. The conductive via structure 160a penetrates the first substrate 110a, the second substrate 120, the first dielectric layer 135 of the third substrate 130, and the fourth substrate 140a, and is electrically connected to the first substrate 110a and the fourth substrate 140 to define the signal path L1. The first substrate 110a, the second substrate 120, the third substrate 130, and the fourth substrate 140a are electrically connected through the conductive structures to define the ground path L2, and the ground path L2 surrounds the signal path L1.

In detail, in this embodiment, the first substrate 110a includes the first core layer 112, the first external circuit layer 114, the first circuit layer 116, and the first conductive vias 118 of the conductive structures. The first external circuit layer 114 and the first circuit layer 116 are respectively disposed on the two opposite sides of the first core layer 112. The first conductive vias 118 penetrate the first core layer 112 and are electrically connected to the first external circuit layer 114 and the first circuit layer 116. The second substrate 120 includes the base 122 and the conductive pillars 124 penetrating the base 122. The third substrate 130 further includes the second core layer 132, the second circuit layer 134, the third circuit layer 136, and the conductive connection layer 138. The second circuit layer 134 and the third circuit layer 136 are respectively disposed on the two opposite sides of the second core layer 132. The conductive pillars 124 of the second substrate 120 are electrically connected to the first circuit layer 116 and the second circuit layer 134 of the first substrate 110a. The second core layer 132 has the opening 133, and the conductive connection layer 138 is disposed on the inner wall of the opening 133 and is located between the first dielectric layer 135 and the second core layer 132. The conductive connection layer 138 is electrically connected to the second circuit layer 134 and the third circuit layer 136. The fourth substrate 140a includes the insulation layer 142, the second external circuit layer 144, and the second conductive vias 148 of the conductive structures. The insulation layer 142 is located between the second external circuit layer 144 and the third circuit layer 136 of the third substrate 130. The second conductive vias 148 penetrate the insulation layer 142 and are electrically connected to the third circuit layer 136 and the second external circuit layer 144. The conductive via structure 160a includes the through via T and the conductive material layer 150. The through via T penetrates the first core layer 112 of the first substrate 110a, the second substrate 120, the first dielectric layer 132 of the third substrate 130, and the insulation layer 142 of the fourth substrate 140a. The conductive material layer 150 covers the inner wall of the through via T and is electrically connected to the first external circuit layer 114 and the second external circuit layer 148.

With reference to FIG. 1H again, the first external circuit layer 114 of this embodiment includes a first signal circuit 114a1 and a first ground circuit 114a2, and the second external circuit layer 144 includes a second signal circuit 144a1 and a second ground circuit 144a2. In particular, the first signal circuit 114a1, the conductive material layer 150, and the second signal circuit 144a1 define the signal path L1. The first ground circuit 114a2, the first conductive vias 118, the first circuit layer 116, the conductive pillars 124, the second circuit layer 134, the conductive connection layer 138, the third circuit layer 136, the second conductive vias 148, and the second ground circuit 144a2 define the ground path L2. Since the signal path L1 is surrounded by the ground path L2 and is enclosed in a closed manner, a good high-frequency high-speed loop may be formed. In addition, both sides of the signal path L1 are respectively located on a same plane with both sides of the ground path L2. Moreover, since the circuit board 100a of this embodiment has the first conductive vias 118, the conductive pillars 124, and the second conductive vias 148, a gap of shielding may be filled to form complete shielding, which may effectively reduce both signal energy loss and noise interference, thereby enhancing signal transmission reliability.

In short, in this embodiment, the signal path L1 defined by the first signal circuit 114a1, the conductive material layer 150, and the second signal circuit 144a1 is surrounded by the ground path L2 defined by the first ground circuit 114a2, the first conductive vias 118, the first circuit layer 116, the conductive pillars 124, the second circuit layer 134, the conductive connection layer 138, the third circuit layer 136, the second conductive vias 148, and the second ground circuit 144a2. In other words, by disposing the well enclosed ground path L2 around the signal path L1 that may transmit high-frequency high-speed signals such as 5G signals, a good high-frequency high-speed loop may be formed so that the circuit board 100a of this embodiment may have better signal integrity. Here, the high frequency refers to a frequency greater than 1 GHz, and the high speed refers to a data transmission speed greater than 100 Mbps. Furthermore, the second substrate 120 and the third substrate 130 provided by this embodiment are finished circuit boards, and the first substrate 110 and the fourth substrate 140 are semi-finished circuit boards. In addition, the first substrate 110, the second substrate 120, the third substrate 130, and the fourth substrate 140 are laminated to be integrated together. Compared with the build-up method in the existing technology where an insulation layer is laminated to form a circuit board structure, the manufacturing method of the circuit board 100a in this embodiment may avoid affecting high-frequency signal integrity. In addition, since the first conductive vias 118, the conductive pillars 124, and the second conductive vias 148 of this embodiment are not located on a same axis, poor thermal stress reliability resulted from stacked vias may be improved.

It should be noted that the following embodiments use the reference numerals and part of the contents of the foregoing embodiments, with the same reference numerals used to denote the same or similar elements, and the description of the same technical contents is omitted. For the description of the omitted part, reference may be made to the foregoing embodiments, and details are not described in the following embodiment.

Figure 2A:
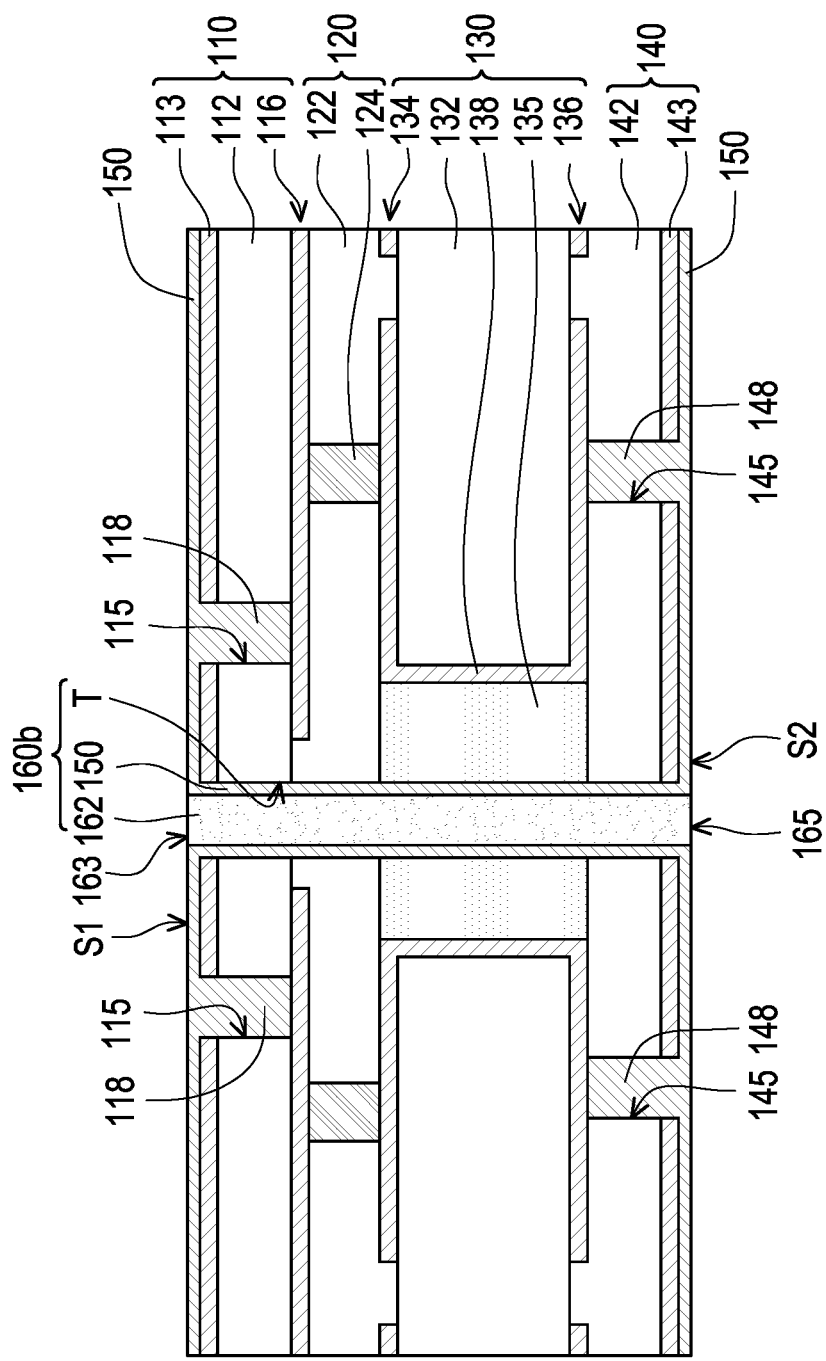
FIG. 2A to FIG. 2B are schematic cross-sectional views of partial steps of a manufacturing method of another circuit board according to another embodiment of the disclosure.
Figure 2B:
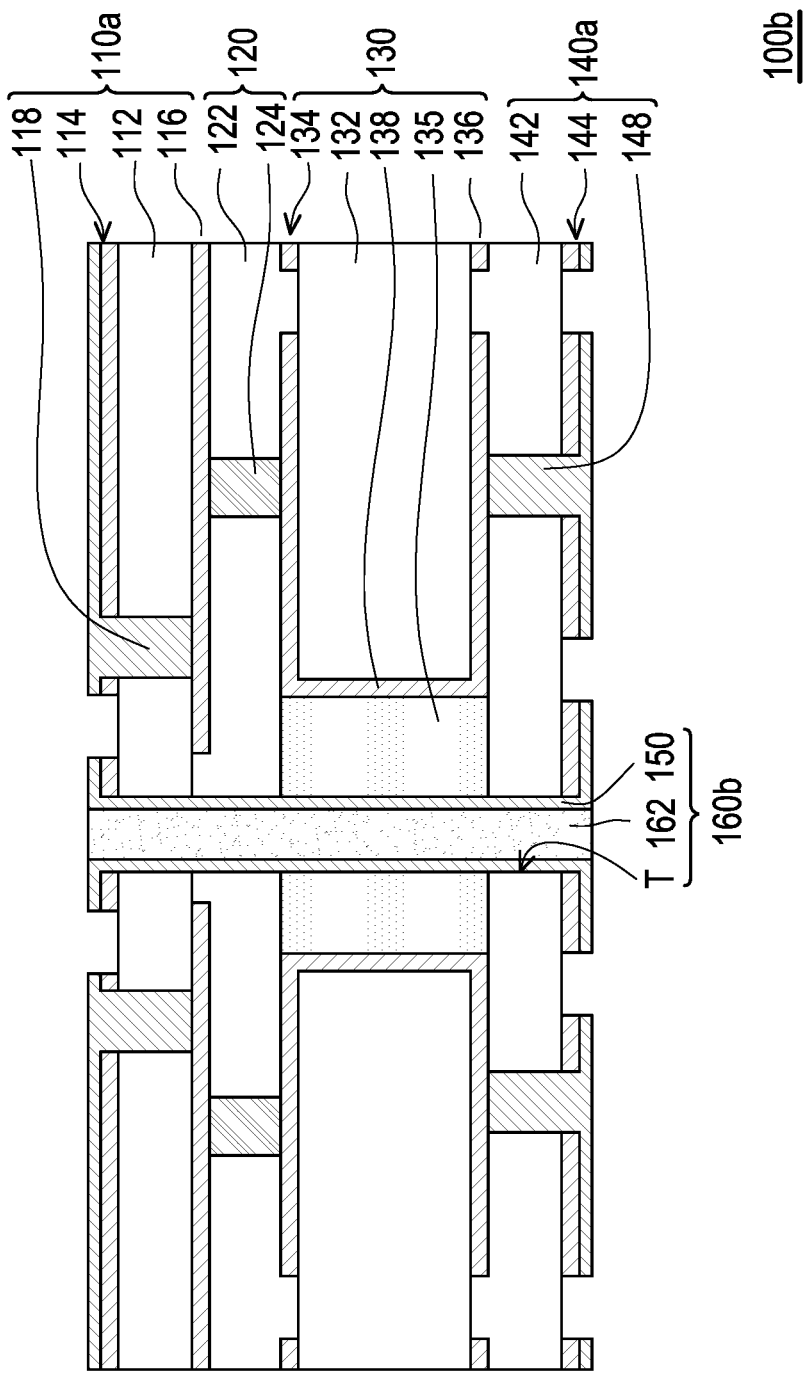

FIG. 2A to FIG. 2B are schematic cross-sectional views of partial steps of a manufacturing method of another circuit board according to another embodiment of the disclosure. With reference to FIG. 1G and FIG. 2A, the manufacturing method of the circuit board in this embodiment is similar to the manufacturing method of the circuit board mentioned above, and the difference between the two lies in that: after the step of forming the conductive material layer 150 in FIG. 1G, with reference to FIG. 2A, a plugging procedure is performed to fill a second dielectric layer 162 in the through via T, and the second dielectric layer 162 fills the through via T; preferably, a first surface 163 and a second surface 165 of the second dielectric layer 162 opposite to each other are respectively aligned with an upper surface S1 and a lower surface S2 of the conductive material layer 150. If the second dielectric layer 162 is higher than the upper surface S1 and the lower surface S2 of the conductive material layer 150, the first surface 163 and the second surface 165 of the second dielectric layer 162 may be respectively aligned with the upper surface S1 and the lower surface S2 of the conductive material layer 150 selectively by polishing. The material of the second dielectric layer 162 is, for example, resin, which may be regarded as a plugging agent. Here, the conductive via structure 160b includes the through via T, the conductive material layer 150, and the second dielectric layer 162 located in the through via T.

In following, with reference to FIG. 2A and FIG. 2B together, a photolithography procedure is performed to pattern the conductive material layer 150, the first conductive layer 113, and the second conductive layer 143 to form a first external circuit layer 114 and a second external circuit layer 144. The first external circuit layer 114 is located on the first core layer 112 of the first substrate 110a, and the second external circuit layer 144 is located on the insulation layer 142 of the fourth substrate 140a. By this time, the manufacturing of a circuit board 100b has been completed.

Figure 3A:
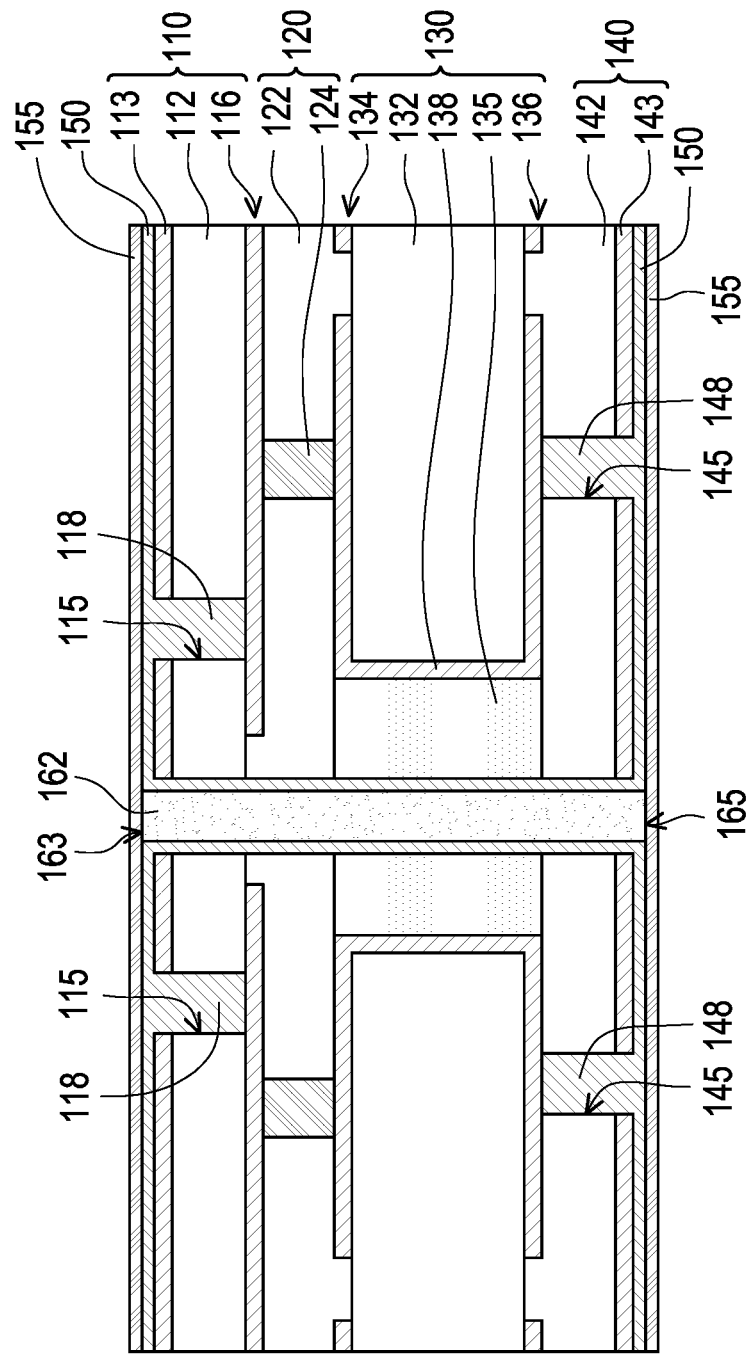
FIG. 3A to FIG. 3B are schematic cross-sectional views of partial steps of a manufacturing method of another circuit board according to another embodiment of the disclosure.
Figure 3B:
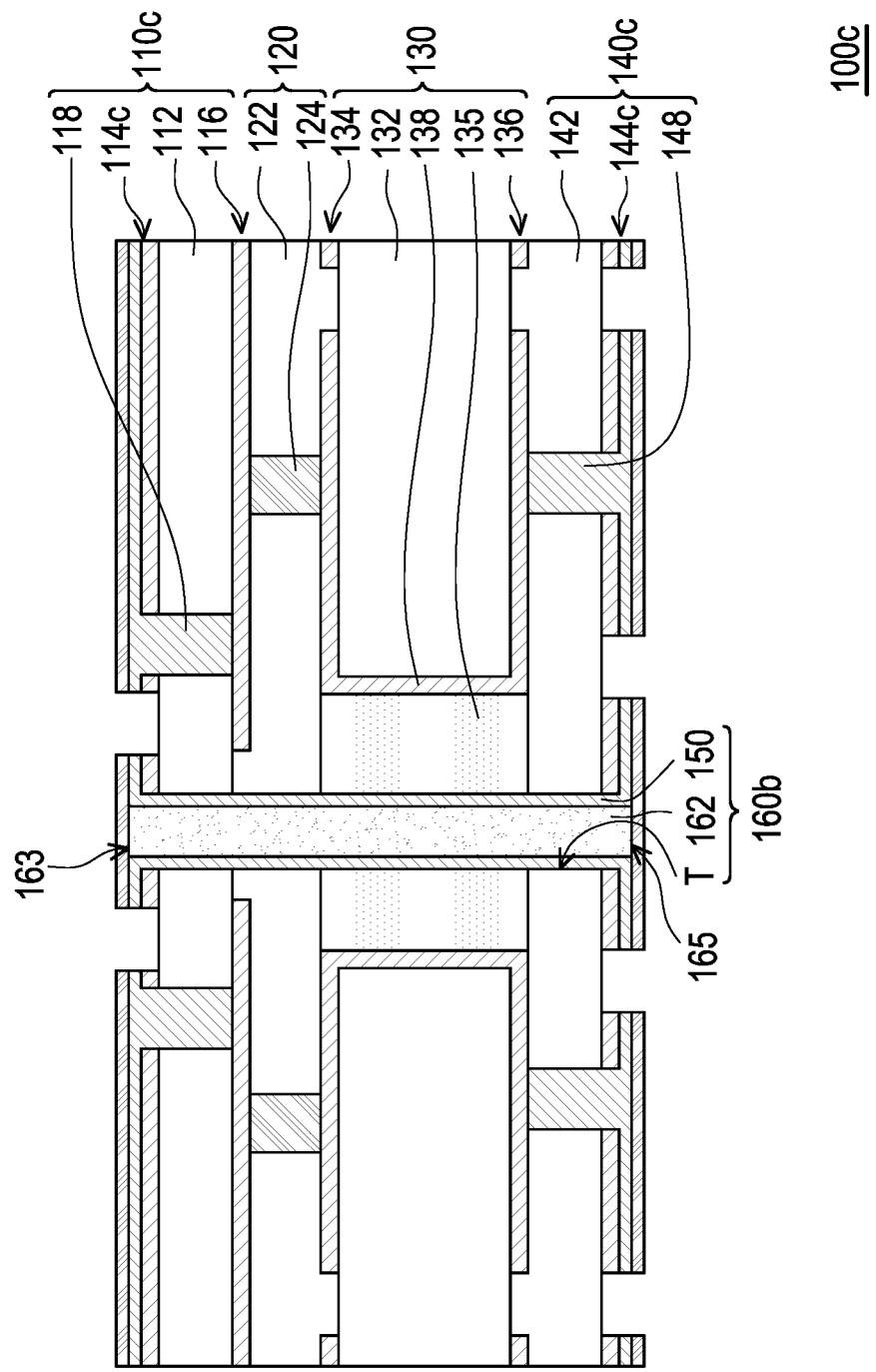

FIG. 3A to FIG. 3B are schematic cross-sectional views of partial steps of a manufacturing method of another circuit board according to another embodiment of the disclosure. With reference to FIG. 2A and FIG. 3A first, the manufacturing method of the circuit board in this embodiment is similar to the manufacturing method of the circuit board mentioned above, and the difference between the two lies in that: after the step of filling the second dielectric layer 162 in the through via T in FIG. 2A, with reference to FIG. 3A, a capping layer 155 is formed on the conductive material layer 150. The capping layer 155 covers the conductive material layer 150 and the first surface 163 and the second surface 165 of the second dielectric layer 162. Here, the material of the capping layer 155 is, for example but not limited to, copper.

In following, with reference to FIG. 3A and FIG. 3B together, a photolithography procedure is performed to pattern the capping layer 155, the conductive material layer 150, the first conductive layer 113, and the second conductive layer 143 to form a first external circuit layer 114c and a second external circuit layer 144c. The first external circuit layer 114c is located on the first core layer 112 of a first substrate 110c and on the first surface 163 of the second dielectric layer 162. The second external circuit layer 144c is located on the insulation layer 142 of a fourth substrate 140c and on the second surface 165 of the second dielectric layer 162. By this time, the manufacturing of a circuit board 100c has been completed.

Figure 4A:
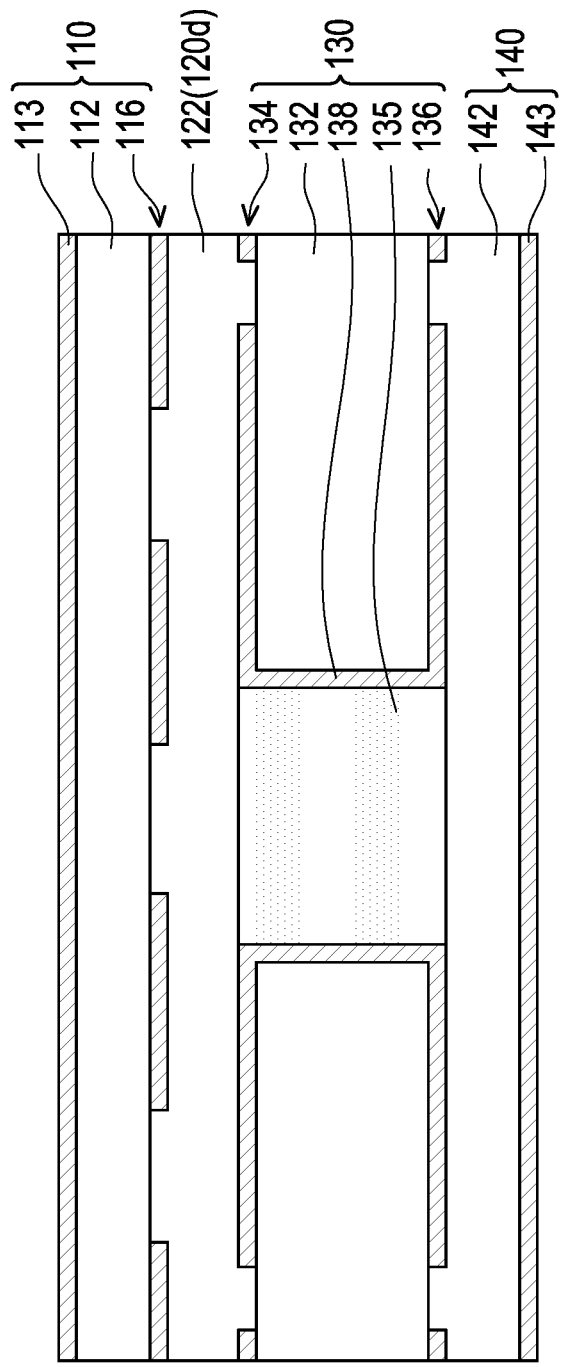
FIG. 4A to FIG. 4D are schematic cross-sectional views of a manufacturing method of another circuit board according to another embodiment of the disclosure.

FIG. 4A to FIG. 4D are schematic cross-sectional views of a manufacturing method of another circuit board according to another embodiment of the disclosure. With reference to FIG. 1E and FIG. 4A first, the manufacturing method of the circuit board in this embodiment is similar to the manufacturing method of the circuit board mentioned above, and the difference between the two lies in that: a second substrate 120d of this embodiment only has the base 122 without the conductive pillars 124 in FIG. 1E. In detail, with reference to FIG. 4A, the first substrate 110, the second substrate 120d, the third substrate 130, and the fourth substrate 140 are provided, and the first substrate 110, the second substrate 120d, the third substrate 130, and the fourth substrate 140 are laminated so that the second substrate 120d is located between the first substrate 110 and the third substrate 130, and that the third substrate 130 is located between the second substrate 120d and the fourth substrate 140.

Figure 4B:
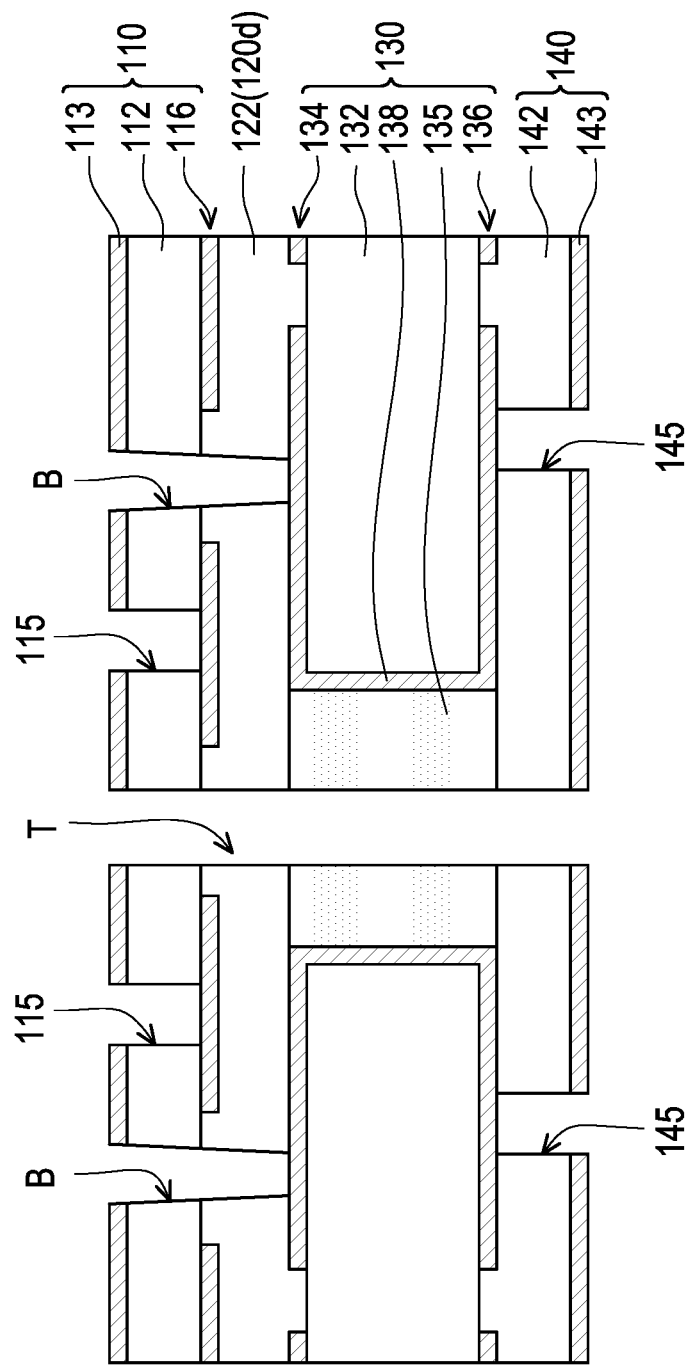

Next, with reference to FIG. 4B, the first blind vias 115, the second blind vias 145, multiple third blind vias B, and the through via T are formed. The first blind vias 115 extend from the first conductive layer 113 to the first circuit layer 116. The second blind vias 145 extend from the second conductive layer 143 to the third circuit layer 136. The third blind vias B extend from the first conductive layer 113 to the second circuit layer 134. The through via T penetrates the first core layer 112 of the first substrate 110, the base 122 of the second substrate 120d, the first dielectric layer 135 of the third substrate 130, and the insulation layer 142 of the fourth substrate 140. Here, the first blind vias 115, the second blind vias 145, and the third blind vias B are formed by, for example, laser drilling, and the through via T is formed by, for example, mechanical drilling, but they are not limited thereto.

Figure 4C:
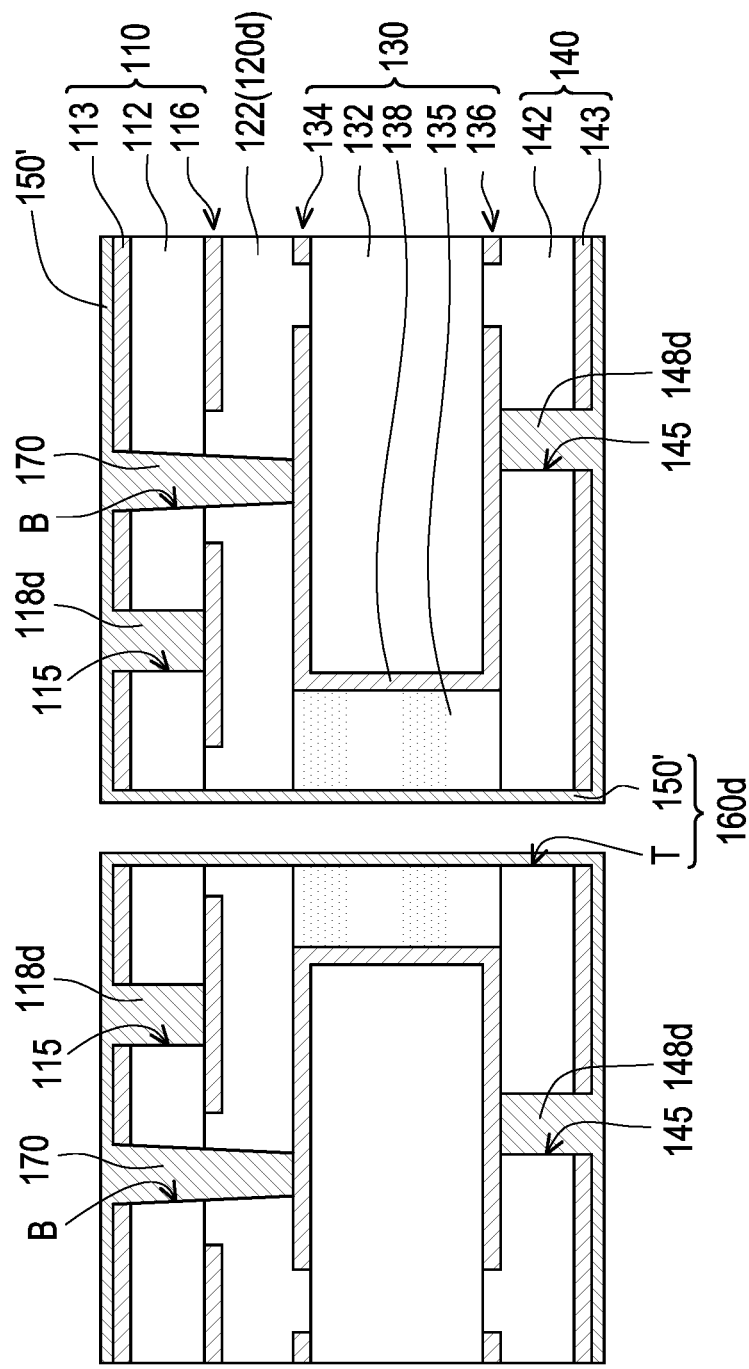

In following, with reference to FIG. 4C, a conductive material layer 150' is formed to fill the first blind vias 115, the second blind vias 145, and the third blind vias B, and extends to cover the first conductive layer 113, the second conductive layer 143, and the inner wall of the through via T. Here, the through via T and the conductive material layer 150' covering the through via T define a conductive via structure 160d. The conductive material layer 150' filling the first blind vias 115 defines multiple first conductive vias 118d of the conductive structures. The conductive material layer 150' filling the second blind vias 145 defines multiple second conductive vias 148d of the conductive structures. The conductive material layer 150' filling the third blind vias B defines multiple third conductive vias 170 of the conductive structures. Here, the conductive material layer 150' is formed by, for example, plating, and the conductive material layer 150' is, for example, copper, but it is not limited thereto.

In other words, in this embodiment, after the first substrate 110, the second substrate 120d, the third substrate 130, and the fourth substrate 140 are laminated, the conductive structures (i.e., the first conductive vias 118d, the second conductive vias 148d, and the third conductive vias 170) and the conductive via structure 160d may be simultaneously formed.

Figure 4D:
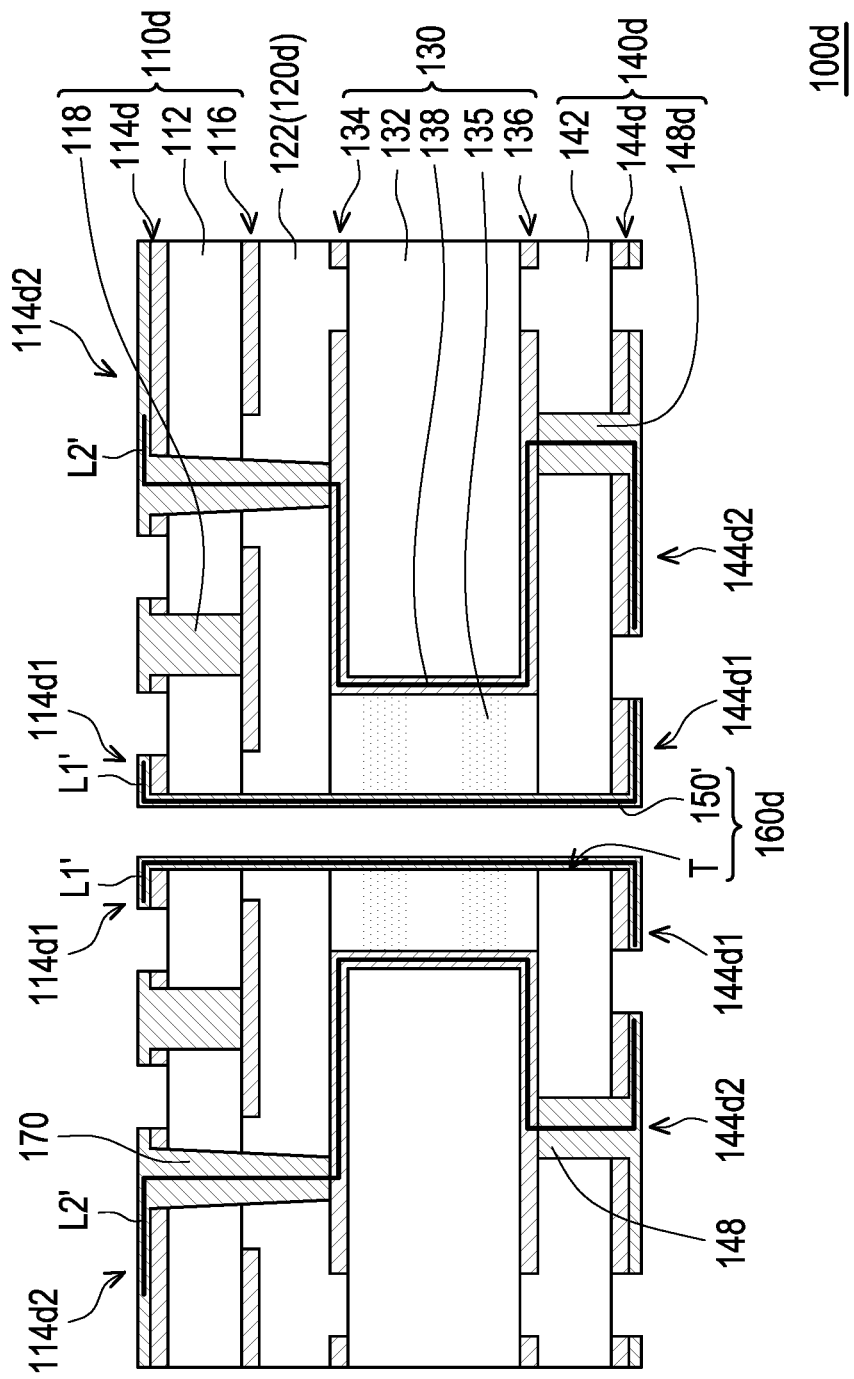

Finally, with reference to FIG. 4C and FIG. 4D together, the conductive material layer 150', the first conductive layer 113, and the second conductive layer 143 are patterned through a photolithography process to form a first external circuit layer 114d and a second external circuit layer 144d. The first external circuit layer 114d is located on the first core layer 112 of a first substrate 110d, and the second external circuit layer 144d is located on the insulation layer 142 of a fourth substrate 140d. Here, the conductive via structure 160d is electrically connected to the first substrate 110d and the fourth substrate 140d to define a signal path L1', and the first substrate 110d, the second substrate 120d, the third substrate 130, and the fourth substrate 140d may be electrically connected through the conductive structures (i.e., the conductive vias 118d, the second conductive vias 148d, and the third conductive vias 170) to define a ground path L2'. The ground path L2' surrounds the signal path L1', and both sides of the signal path L1' are respectively located on a same plane with both sides of the ground path L2'. By this time, the manufacturing of a circuit board 100d has been completed.

In terms of structure, with reference to FIG. 1H and FIG. 4D together, the circuit board 100d of this embodiment is similar to the circuit board 100a mentioned above, and the difference between the two lies in that: the second substrate 120d of this embodiment only includes the base 122 without the conductive pillars 124, and the conductive structures further include the third conductive vias 170, which penetrate the first core layer 112 of the first substrate 110d and the second substrate 120d, and are electrically connected to the first external circuit layer 114d and the second circuit layer 134. Furthermore, the first external circuit layer 114d of this embodiment includes a first signal circuit 114d1 and a first ground circuit 114d2, and the second external circuit layer 144d includes a second signal circuit 144d1 and a second ground circuit 144d2. The first signal circuit 114d1, the conductive material layer 150', and the second signal circuit 144d1 define the signal path L1'. The first ground circuit 114d2, the third conductive vias 170, the second circuit layer 134, the conductive connection layer 138, the third circuit layer 136, the second conductive vias 148d, and the second ground circuit 144d2 define the ground path L2'.

In short, the signal path L1' defined by the first signal circuit 114d1, the conductive material layer 150', and the second signal circuit 144d1 of this embodiment is surrounded by the ground path L2' defined by the first ground circuit 114d2, the third conductive vias 170, the second circuit layer 134, the conductive connection layer 138, the third circuit layer 136, the second conductive vias 148d, and the second ground circuit 144d2. In other words, by disposing the well enclosed ground path L2' around the signal path L1' that may transmit high-frequency high-speed signals such as 5G signals, a good high-frequency high-speed loop may be formed so that the circuit board 100d of this embodiment may have better signal integrity.

Figure 5A:
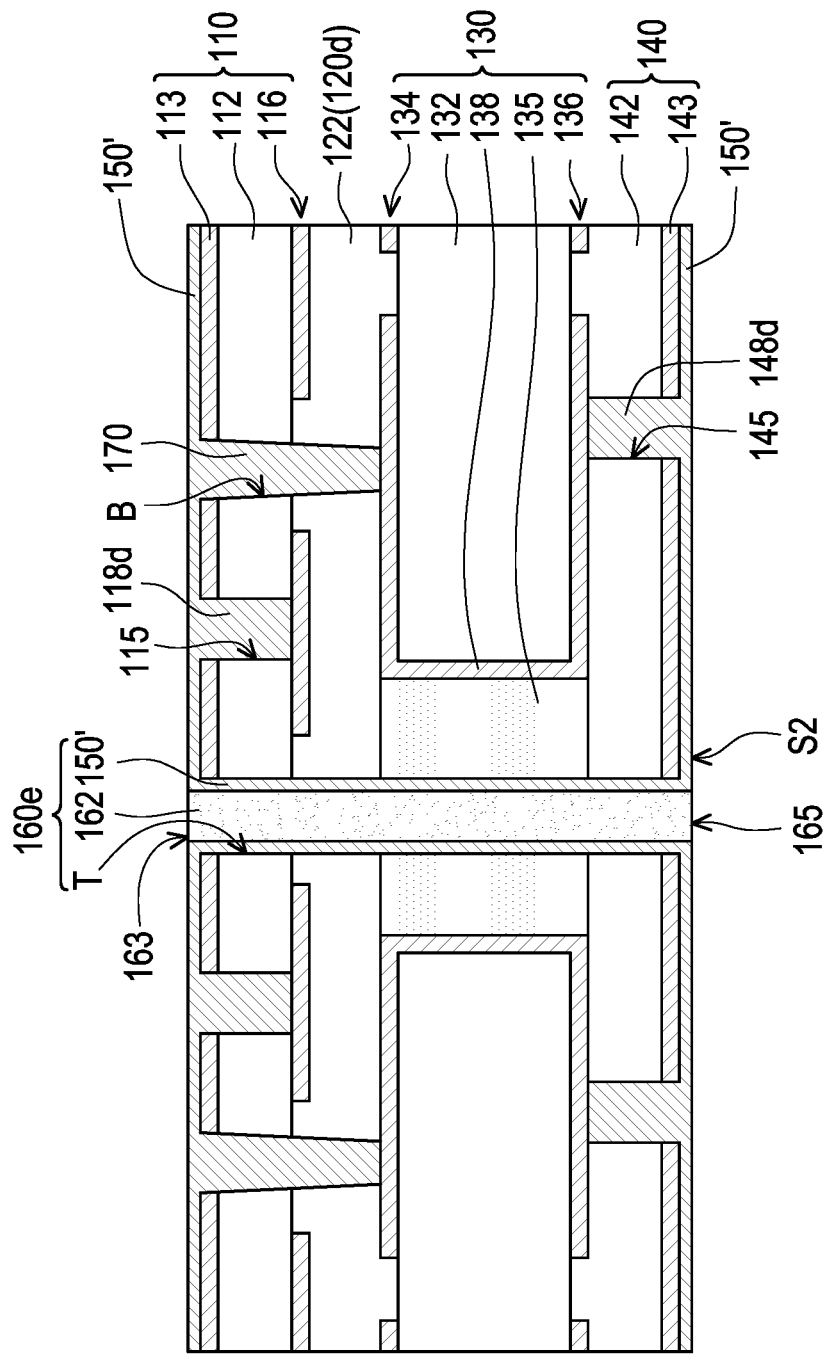
FIG. 5A to FIG. 5B are schematic cross-sectional views of partial steps of a manufacturing method of another circuit board according to another embodiment of the disclosure.
Figure 5B:
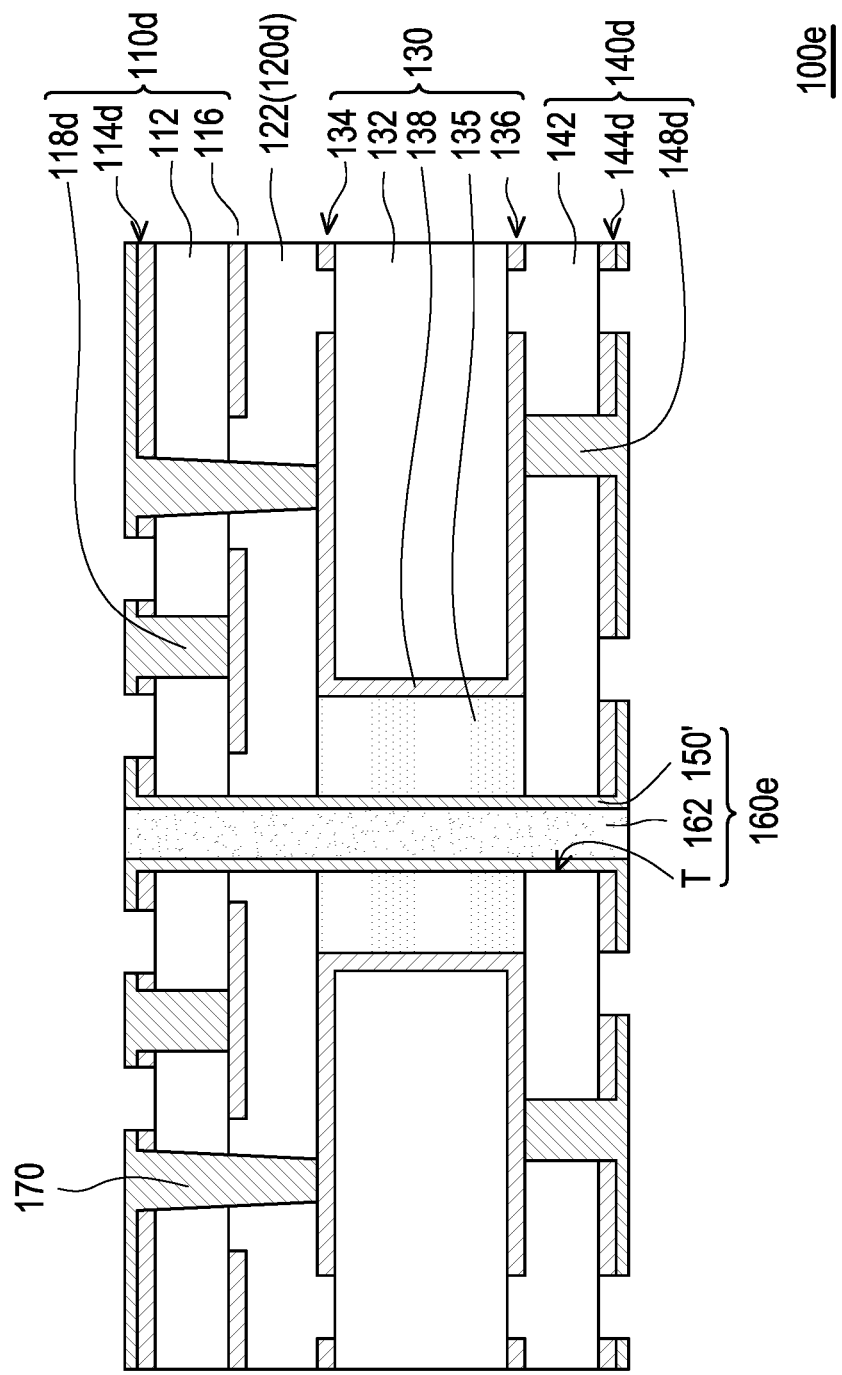

FIG. 5A to FIG. 5B are schematic cross-sectional views of partial steps of a manufacturing method of another circuit board according to another embodiment of the disclosure. With reference to FIG. 4C and FIG. 5A first, the manufacturing method of the circuit board in this embodiment is similar to the manufacturing method of the circuit board mentioned above, and the difference between the two lies in that: after the step of forming the conductive material layer 150' in FIG. 4C, with reference to FIG. 5A, a plugging procedure is performed to fill a second dielectric layer 162 in the through via T, and the second dielectric layer 162 fills the through via T; in addition, a first surface 163 and a second surface 165 of the second dielectric layer 162 opposite to each other are respectively aligned with an upper surface S1 and a lower surface S2 of the conductive material layer 150'. If the second dielectric layer 162 is higher than the upper surface S1 and the lower surface S2 of the conductive material layer 150', the first surface 163 and the second surface 165 of the second dielectric layer 162 may be respectively aligned with the upper surface S1 and the lower surface S2 of the conductive material layer 150' selectively by polishing. The material of the second dielectric layer 162 is, for example, resin, which may be regarded as a plugging agent. Here, a conductive via structure 160e includes the through via T, the conductive material layer 150', and the second dielectric layer 162 located in the through via T.

In following, with reference to FIG. 5A and FIG. 5B together, a photolithography procedure is performed to pattern the conductive material layer 150', the first conductive layer 113, and the second conductive layer 143 to form a first external circuit layer 114d and a second external circuit layer 144d. The first external circuit layer 114d is located on the first core layer 112 of the first substrate 110d, and the second external circuit layer 144d is located on the insulation layer 142 of the fourth substrate 140d. By this time, the manufacturing of a circuit board 100e has been completed.

Figure 6A:
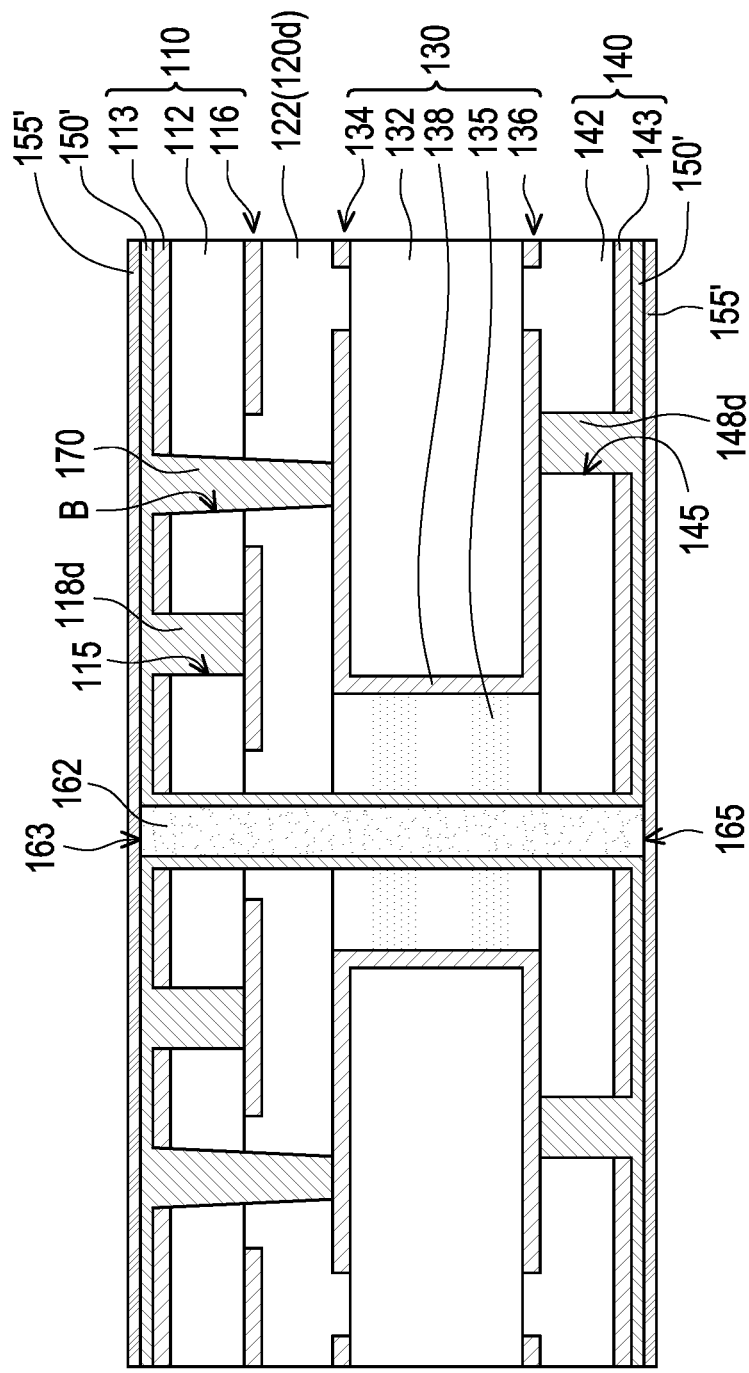
FIG. 6A to FIG. 6B are schematic cross-sectional views of partial steps of a manufacturing method of another circuit board according to another embodiment of the disclosure.
Figure 6B:
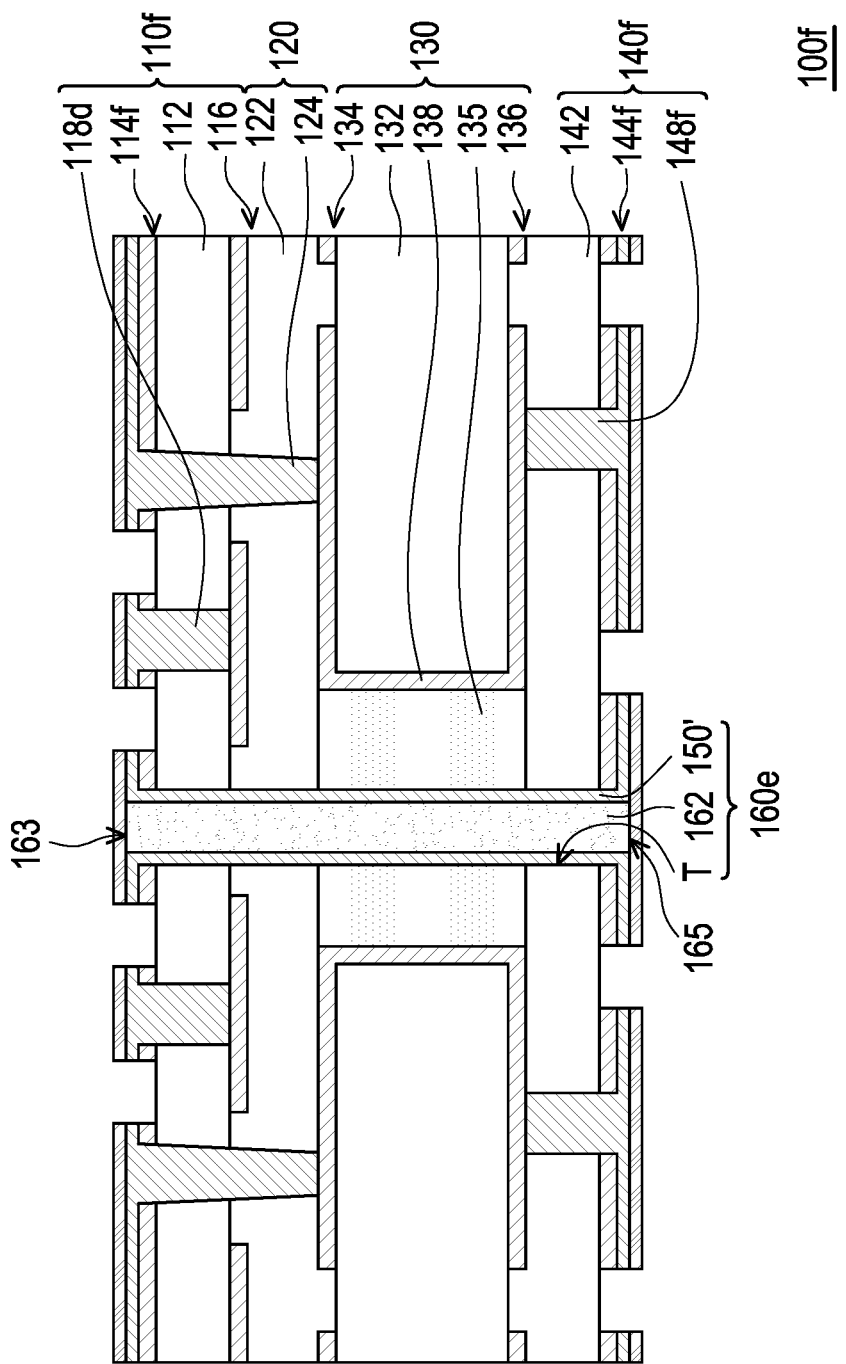

FIG. 6A to FIG. 6B are schematic cross-sectional views of partial steps of a manufacturing method of another circuit board according to another embodiment of the disclosure. With reference to FIG. 5A and FIG. 6A first, the manufacturing method of the circuit board in this embodiment is similar to the manufacturing method of the circuit board mentioned above, and the difference between the two lies in that: after the step of filling the second dielectric layer 162 in the through via T in FIG. 5A, with reference to FIG. 6A, a capping layer 155' is formed on the conductive material layer 150'. The capping layer 155' covers the conductive material layer 150' and the first surface 163 and the second surface 165 of the second dielectric layer 162. Here, the material of the capping layer 155' is, for example but not limited to, copper.

In following, with reference to FIG. 6A and FIG. 6B together, a photolithography procedure is performed to pattern the capping layer 155', the conductive material layer 150', the first conductive layer 113, and the second conductive layer 143 to form a first external circuit layer 114f and a second external circuit layer 144f. The first external circuit layer 114f is located on the first core layer 112 of a first substrate 110f and on the first surface 163 of the second dielectric layer 162. A fourth substrate 140f includes the insulation layer 142, the second external circuit layer 144f, and multiple second conductive vias 148f, and the second external circuit layer 144f is located on the insulation layer 142 of the fourth substrate 140f and on the second surface 165 of the second dielectric layer 162. By this time, the manufacturing of a circuit board 100f has been completed.

Figure 7:
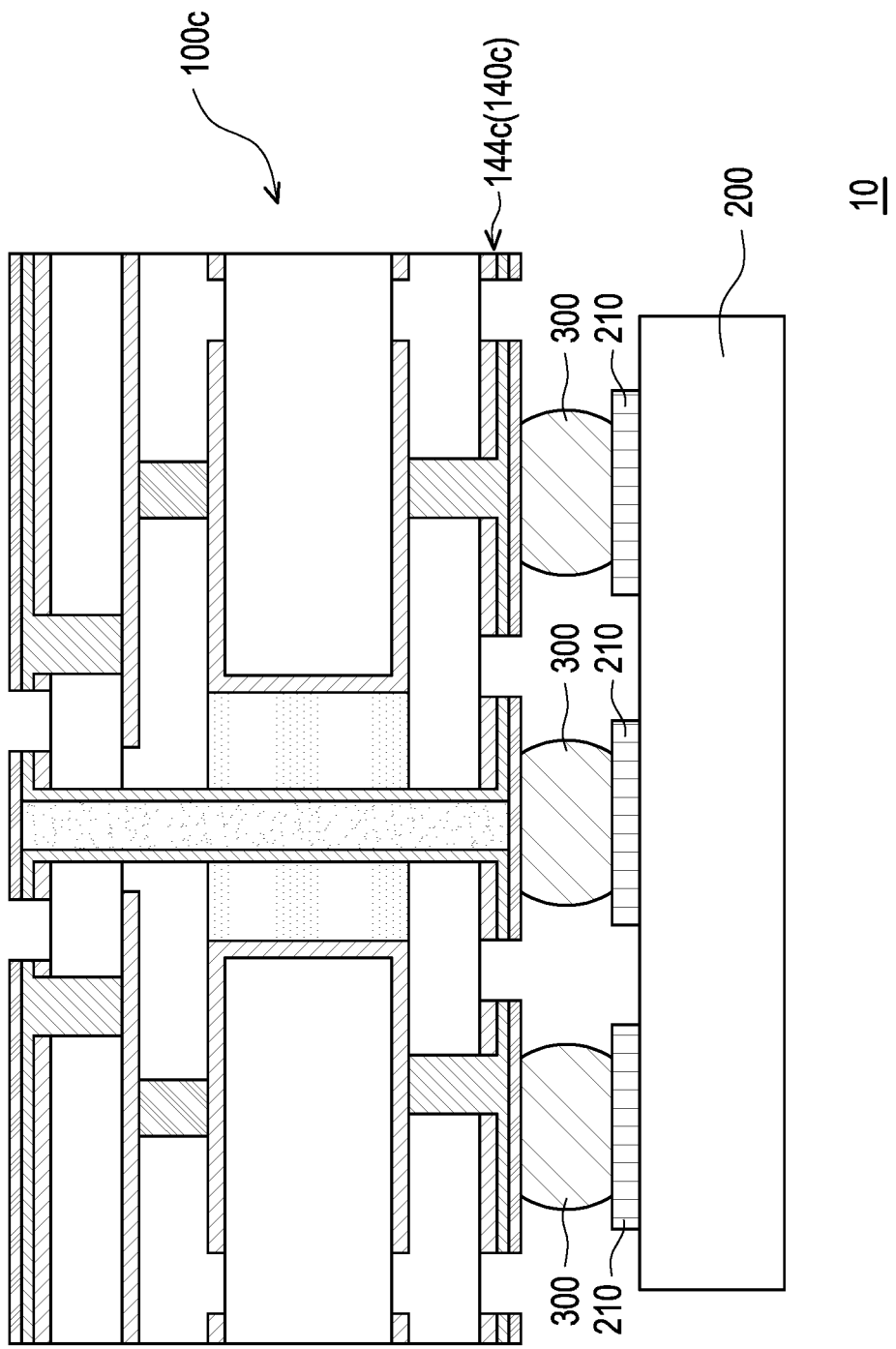
FIG. 7 is a schematic cross-sectional view of an electronic device of an embodiment according to the disclosure.

FIG. 7 is a schematic cross-sectional view of an electronic device of an embodiment according to the disclosure. With reference to FIG. 7, in this embodiment, an electronic device 10 includes, for example, the above circuit board 100c in FIG. 3B and an electronic element 200. The electronic element 200 is electrically connected to the circuit board 100c, and the electronic element 200 includes multiple pads 210. In addition, the electronic device 10 of this embodiment further includes multiple connectors 300, disposed between the fourth substrate 140c of the circuit board 100c and the electronic element 200, and the electronic element 200 is electrically connected to the circuit board 100c through the connectors 300. Here, the connector 300 is, for example but not limited to, a solder ball. In terms of application, an antenna structure may be disposed on a side of the circuit board 100c opposite to the electronic element 200, and the antenna structure may be electrically connected to the circuit board 100c. In application of integrated circuits and antennas, the circuit board 100c of this embodiment may solve the problem of signal interference on a same plane, and may reduce both signal energy loss and noise interference, thereby enhancing signal transmission reliability.

In summary, in the design of the manufacturing method of the circuit board of the disclosure, the conductive via structure is formed to penetrate the first substrate, the second substrate, the first dielectric layer of the third substrate, and the fourth substrate. The conductive via structure is electrically connected to the first substrate and the fourth substrate to define a signal path, and the ground path surrounds the signal path. In this way, a good high-frequency high-speed signal loop may be formed. Moreover, in subsequent application of integrated circuits and antennas, the problem of signal interference on a same plane may also be solved, and signal energy loss and noise interference may both be reduced. Therefore, signal transmission reliability may be enhanced.

Although the disclosure has been described with reference to the above embodiments, they are not intended to limit the disclosure. It will be apparent to one of ordinary skill in the art that modifications to the described embodiments may be made without departing from the spirit and the scope of the disclosure. Accordingly, the scope of the disclosure will be defined by the attached claims and their equivalents and not by the above detailed descriptions.

What is claimed is:

1. A manufacturing method of a circuit board, comprising:
   providing a first substrate, a second substrate, a third substrate, and a fourth substrate, wherein the third substrate has an opening and comprises a first dielectric layer, the opening penetrates the third substrate, and the first dielectric layer fills the opening;
   laminating the first substrate, the second substrate, the third substrate, and the fourth substrate for the second substrate to be located between the first substrate and the third substrate and for the third substrate to be located between the second substrate and the fourth substrate;
   forming a plurality of conductive structures for the first substrate, the second substrate, the third substrate, and the fourth substrate to be electrically connected through the plurality of conductive structures to define a ground path; and
   forming a conductive via structure to penetrate the first substrate, the second substrate, the first dielectric layer of the third substrate, and the fourth substrate, wherein the conductive via structure is electrically connected to the first substrate and the fourth substrate to define a signal path, and the ground path surrounds the signal path.

2. The manufacturing method of the circuit board according to claim 1, wherein providing the first substrate, the second substrate, the third substrate, and the fourth substrate comprises:
   providing the first substrate, comprising a first core layer, a first conductive layer, and a first circuit layer, wherein the first conductive layer and the first circuit layer are respectively disposed on two opposite sides of the first core layer;
   providing the second substrate, comprising a base and a plurality of conductive pillars penetrating the base;
   providing the third substrate, further comprising a second core layer, a second circuit layer, a third circuit layer, and a conductive connection layer, wherein the second circuit layer and the third circuit layer are respectively disposed on two opposite sides of the second core layer, the plurality of conductive pillars of the second substrate are electrically connected to the first circuit layer and the second circuit layer, the second core layer has the opening, the conductive connection layer covers an inner wall of the opening and is located between the first dielectric layer and the second core layer, and the conductive connection layer is electrically connected to the second circuit layer and the third circuit layer; and
   providing the fourth substrate, comprising an insulation layer and a second conductive layer, wherein the insulation layer is located between the third circuit layer and the second conductive layer.

3. The manufacturing method of the circuit board according to claim 2, wherein the plurality of conductive structures and the conductive via structure are simultaneously formed after the first substrate, the second substrate, the third substrate, and the fourth substrate are laminated.

4. The manufacturing method of the circuit board according to claim 3, wherein forming the plurality of conductive structures and the conductive via structure comprises:
   forming a plurality of first blind vias, a plurality of second blind vias, and a through via, wherein the plurality of first blind vias extend from the first conductive layer to the first circuit layer, the plurality of second blind vias extend from the second conductive layer to the third circuit layer, and the through via penetrates the first core layer of the first substrate, the second substrate, the first dielectric layer of the third substrate, and the insulation layer of the fourth substrate; and
   forming a conductive material layer to fill the plurality of first blind vias and the plurality of second blind vias and extend to cover the first conductive layer, the second conductive layer, and an inner wall of the through via, wherein the through via and the conductive material layer covering the through via define the conductive via structure, the conductive material layer filling the plurality of first blind vias defines a plurality of first conductive vias of the plurality of conductive structures, and the conductive material layer filling the plurality of second blind vias defines a plurality of second conductive vias of the plurality of conductive structures.

5. The manufacturing method of the circuit board according to claim 4, further comprising:
   patterning the conductive material layer, the first conductive layer, and the second conductive layer after forming the plurality of conductive structures and the conductive via structure, to form a first external circuit layer and a second external circuit layer, wherein the first external circuit layer is located on the first core layer of the first substrate, and the second external circuit layer is located on the insulation layer of the fourth substrate.

6. The manufacturing method of the circuit board according to claim 5, wherein the first external circuit layer comprises a first signal circuit and a first ground circuit, the second external circuit layer comprises a second signal circuit and a second ground circuit, the first signal circuit, the conductive material layer, and the second signal circuit define the signal path, and the first ground circuit, the plurality of first conductive vias, the first circuit layer, the plurality of conductive pillars, the second circuit layer, the conductive connection layer, the third circuit layer, the plurality of second conductive vias, and the second ground circuit define the ground path.

7. The manufacturing method of the circuit board according to claim 4, wherein forming the conductive via structure further comprises:
filling a second dielectric layer in the through via, the second dielectric layer filling the through via, wherein a first surface and a second surface of the second dielectric layer opposite to each other are respectively aligned with an upper surface and a lower surface of the conductive material layer.

8. The manufacturing method of the circuit board according to claim 7, further comprising:
forming a capping layer on the conductive material layer after forming the conductive via structure, wherein the capping layer covers the conductive material layer and the first surface and the second surface of the second dielectric layer; and
patterning the capping layer, the conductive material layer, the first conductive layer, and the second conductive layer to form a first external circuit layer and a second external circuit layer, wherein the first external circuit layer is located on the first core layer of the first substrate and on the first surface of the second dielectric layer, and the second external circuit layer is located on the insulation layer of the fourth substrate and on the second surface of the second dielectric layer.

9. The manufacturing method of the circuit board according to claim 1, wherein providing the first substrate, the second substrate, the third substrate, and the fourth substrate comprises:
providing the first substrate, comprising a first core layer, a first conductive layer, and a first circuit layer, wherein the first conductive layer and the first circuit layer are respectively disposed on two opposite sides of the first core layer;
providing the second substrate, comprising a base;
providing the third substrate, further comprising a second core layer, a second circuit layer, a third circuit layer, and a conductive connection layer, wherein the second circuit layer and the third circuit layer are respectively disposed on two opposite sides of the second core layer, the second core layer has the opening, the conductive connection layer covers an inner wall of the opening and is located between the first dielectric layer and the second core layer, and the conductive connection layer is electrically connected to the second circuit layer and the third circuit layer; and
providing the fourth substrate, comprising an insulation layer and a second conductive layer, wherein the insulation layer is located between the third circuit layer and the second conductive layer.

10. The manufacturing method of the circuit board according to claim 9, wherein the plurality of conductive structures and the conductive via structure are simultaneously formed after the first substrate, the second substrate, the third substrate, and the fourth substrate are laminated.

11. The manufacturing method of the circuit board according to claim 10, wherein forming the plurality of conductive structures and the conductive via structure comprises:
forming a plurality of first blind vias, a plurality of second blind vias, a plurality of third blind vias, and a through via, wherein the plurality of first blind vias extend from the first conductive layer to the first circuit layer, the plurality of second blind vias extend from the second conductive layer to the third circuit layer, the plurality of third blind vias extend from the first conductive layer to the second circuit layer, and the through via penetrates the first core layer of the first substrate, the second substrate, the first dielectric layer of the third substrate, and the insulation layer of the fourth substrate; and
forming a conductive material layer to fill the plurality of first blind vias, the plurality of second blind vias, and the plurality of third blind vias, and extend to cover the first conductive layer, the second conductive layer, and an inner wall of the through via, wherein the through via and the conductive material layer covering the through via define the conductive via structure, the conductive material layer filling the plurality of first blind vias defines a plurality of first conductive vias of the plurality of conductive structures, the conductive material layer filling the plurality of second blind vias defines a plurality of second conductive vias of the plurality of conductive structures, and the conductive material layer filling the plurality of third blind vias defines a plurality of third conductive vias of the plurality of conductive structures.

12. The manufacturing method of the circuit board according to claim 11, further comprising:
patterning the conductive material layer, the first conductive layer, and the second conductive layer after forming the plurality of conductive structures and the conductive via structure, to form a first external circuit layer and a second external circuit layer, wherein the first external circuit layer is located on the first core layer of the first substrate, and the second external circuit layer is located on the insulation layer of the fourth substrate.

13. The manufacturing method of the circuit board according to claim 12, wherein the first external circuit layer comprises a first signal circuit and a first ground circuit, the second external circuit layer comprises a second signal circuit and a second ground circuit, the first signal circuit, the conductive material layer, and the second signal circuit define the signal path, and the first ground circuit, the plurality of third conductive vias, the second circuit layer, the conductive connection layer, the third circuit layer, the plurality of second conductive vias, and the second ground circuit define the ground path.

14. The manufacturing method of the circuit board according to claim 11, wherein forming the conductive via structure further comprises:
filling a second dielectric layer in the through via, the second dielectric layer filling the through via, wherein a first surface and a second surface of the second dielectric layer opposite to each other are respectively aligned with an upper surface and a lower surface of the conductive material layer.

15. The manufacturing method of the circuit board according to claim 14, further comprising:
forming a capping layer on the conductive material layer after forming the conductive via structure, wherein the capping layer covers the conductive material layer and the first surface and the second surface of the second dielectric layer; and
patterning the capping layer, the conductive material layer, the first conductive layer, and the second conductive layer to form a first external circuit layer and a second external circuit layer, wherein the first external circuit layer is located on the first core layer of the first substrate and on the first surface of the second dielectric layer, and the second external circuit layer is located on the insulation layer of the fourth substrate and on the second surface of the second dielectric layer.

* * * * *